US008729617B2

(12) United States Patent
Kim

(10) Patent No.: US 8,729,617 B2
(45) Date of Patent: May 20, 2014

(54) SEMICONDUCTOR MEMORY DEVICE AND METHOD FOR MANUFACTURING THE SAME

(75) Inventor: Tae Kyun Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 130 days.

(21) Appl. No.: 13/368,054

(22) Filed: Feb. 7, 2012

(65) Prior Publication Data

US 2012/0217570 A1    Aug. 30, 2012

(30) Foreign Application Priority Data

Feb. 28, 2011    (KR) .................. 10-2011-0018167

(51) Int. Cl.
*H01L 27/108*    (2006.01)

(52) U.S. Cl.
USPC ........... 257/302; 257/135; 257/220; 257/296; 257/300; 438/137; 438/156; 438/192; 438/212; 438/268

(58) Field of Classification Search
None
See application file for complete search history.

(56) References Cited

U.S. PATENT DOCUMENTS

2008/0191257 A1    8/2008    Temmler et al.
2011/0121288 A1    5/2011    Yamazaki et al.

FOREIGN PATENT DOCUMENTS

| KR | 1020010104378 A | 11/2001 |
| KR | 1020090099774 A | 9/2009 |
| KR | 1020090107821 A | 10/2009 |
| KR | 1020100128465 A | 12/2010 |

*Primary Examiner* — Hoang-Quan Ho
*Assistant Examiner* — Cuong B Nguyen
(74) *Attorney, Agent, or Firm* — William Park & Associates Patent Ltd.

(57) ABSTRACT

A semiconductor memory device includes: a lower pillar protruding from a substrate in a vertical direction and extending in a first direction by a trench formed in the first direction; an upper pillar protruding on the lower pillar in a second direction perpendicular to the first direction; a buried bit line junction region disposed on one sidewall of the lower pillar; a buried bit line contacting the buried bit line junction region and filling a portion of the trench; an etch stop film disposed on an exposed surface of the buried bit line; a first interlayer dielectric film recessed to expose a portion of an outer side of at least the upper pillar disposed on the etch stop film; a second interlayer dielectric film disposed on the first interlayer dielectric film; and a gate surrounding the exposed outer side of the upper pillar and crossing the buried bit line.

11 Claims, 37 Drawing Sheets

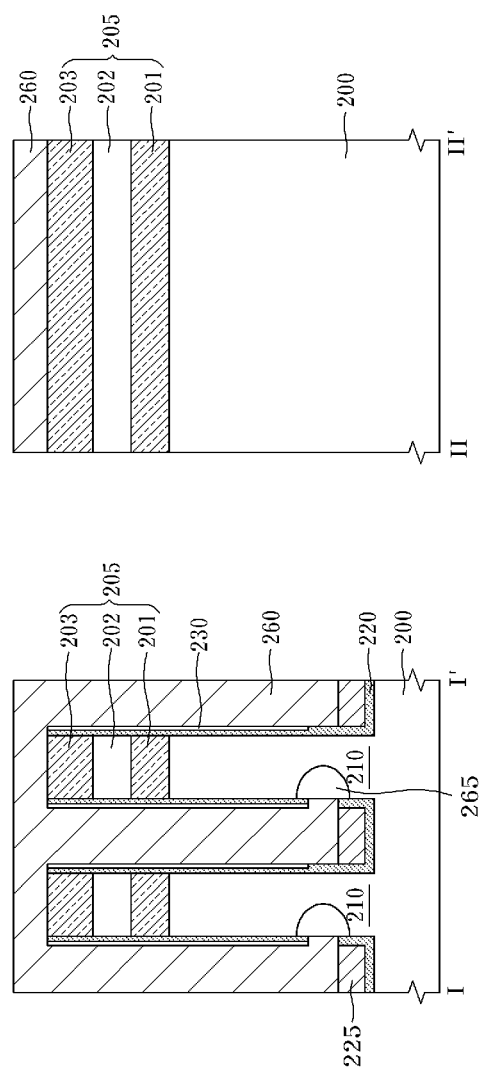

SEMICONDUCTOR MEMORY DEVICE AND METHOD FOR MANUFACTURING THE SAME

CROSS-REFERENCES TO RELATED APPLICATIONS

The present application claims priority under 35 U.S.C 119(a) to Korean Application No. 10-2011-0018167, filed on Feb. 28, 2011, in the Korean intellectual property Office, which is incorporated herein by reference in its entirety.

BACKGROUND

Exemplary embodiments of the present invention relate to a semiconductor device, and more particularly, to a semiconductor memory device and a method for manufacturing the same.

Portable mobile devices small in size and miniaturized digital home appliances are widely in use. In coping with such trends, the semiconductor memory devices for use in mobile devices or digital home appliances are highly integrated. Particularly for DRAM or flash memory devices, it is an ongoing effort to find ways to store a larger quantity of information in a limited space. The basic components of a DRAM device are transistors and capacitors. The transistor and capacitor are made in a stack structure, in which the transistor is formed on a silicon semiconductor substrate and the capacitor is formed on the transistor.

For electrical connection between the transistor and the capacitor, a storage node contact is disposed between a source region of the transistor and a lower electrode of the capacitor. In addition, a drain region of the transistor is electrically connected to a bit line through a bit line contact. In the structure in which the capacitor is disposed on the planar type transistor, films for signal transmission (for example, a word line and a bit line) are disposed between the transistor and the capacitor. Hence, there is a limit to increasing the capacity of the capacitor due to the space occupied by the films. Moreover, as a gate width of the planar type transistor is narrowed to less than 40 nm, a larger amount of power is consumed and an amount of a body current, which is a leakage current between the source region and the drain region of the transistor, is abruptly increased. To overcome these limitations associated with planar type transistors, the concept of vertical transistors has been studied.

FIG. 1 is drawn to show the basic vertical transistor concept. Referring to FIG. 1, the vertical transistor 100 has a drain region 112 formed at the lower portion of the semiconductor substrate 110 with respect to the gate electrode 120 and a source region 114 formed at the upper portion of the semiconductor substrate 110 with respect to the gate electrode 120. A channel region 116 is formed in the semiconductor substrate 110 in a vertical direction between the drain region 112 and the source region 114. A gate dielectric film 118 and the gate electrode 120 are sequentially disposed over the channel region 116 on the lateral side of the semiconductor substrate 110. When the vertical transistor 100 is applied to a DRAM device, a bit line is coupled to the drain region 112 and a storage node is coupled to the source region 114. The bit line is disposed so as to be buried in the lower side portion of the semiconductor substrate 110, and, unlike the planar type transistor, the space for forming the storage node is not reduced. Thus, the data storage capacity may not be suppressed in spite of the high degree of integration.

However, in order to form a vertical transistor as described above, it is necessary to form the drain region 112 at one side of the semiconductor substrate 110 on the lower portion with respect to the gate electrode 120. This process is not easy. For example, before forming the drain region 112, a conductive film doped at a high concentration is formed on the portion of the silicon substrate 110 where the drain region 112 is to be formed (that is, on the side of the lower portion of the silicon substrate 110 with respect to the gate electrode 120). Then, the dopants doped in the conductive film are diffused into the lower portion of the semiconductor substrate 110 to thereby form the drain region 112. However, with high integration of semiconductor devices resulting in overall size reduction of the semiconductor devices, it is difficult to form the drain region 112 of the vertical transistor 110 for accurate size and positioning in the semiconductor substrate 110.

SUMMARY

An embodiment of the present invention is directed to a semiconductor memory device, which can improve the contact resistance characteristic of a gate by increasing an area of an active region contacting the gate in a process of forming a vertical transistor and can ensure the stability and reliability of a semiconductor device by increasing a channel width, and a method for manufacturing the same.

A semiconductor memory device includes: a lower pillar protruding from a substrate in a vertical direction and extending in a first direction of a substrate by a trench formed in the first direction of the substrate; an upper pillar protruding on the lower pillar in a second direction perpendicular to the first direction; a buried bit line junction region disposed on one sidewall of the lower pillar; a buried bit line contacting the buried bit line junction region and filling a portion of the trench; an etch stop film disposed on an exposed surface of the buried bit line; a first interlayer dielectric film recessed to expose a portion of an outer side of at least the upper pillar disposed on the etch stop film; a second interlayer dielectric film disposed on the first interlayer dielectric film; and a gate surrounding the exposed outer side of the upper pillar and crossing the buried bit line.

Further, a method of manufacturing a semiconductor memory device includes: forming a trench in a first direction of a substrate to form a pillar protruding from the substrate in a vertical direction; forming a buried bit line filling a portion of the trench in the first direction of the substrate; forming an etch stop film on an exposed surface of the buried bit line; forming an interlayer dielectric film on the etch stop film, the interlayer dielectric film including at least two layers having different etch selectivities; forming a lower pillar and an upper pillar by etching the interlayer dielectric film and the pillar in a direction crossing the buried bit line, the lower pillar protruding from the substrate in a vertical direction and extending in the first direction of the substrate, the upper pillar being disposed on the lower pillar and protruding in a second direction perpendicular to the first direction; recessing the interlayer dielectric film to expose a portion of an outer side of the upper pillar; and forming a gate surrounding the outer side of the upper pillar and extending up to the recessed portion of the upper pillar.

Further yet, a method of manufacturing a semiconductor memory device includes: forming a hard mask pattern on a substrate by stacking a first hard mask and second and third hard masks having different etch selectivities from the first hard mask; forming a pillar protruding from the substrate in a vertical direction by forming a first trench in a first direction of the substrate by an etch process using the hard mask pattern as an etch mask; forming a buried bit line filling a portion of the trench in the first direction of the substrate; filling the trench, including the buried bit line, with the same material as the third mask; forming an etch stop film to the exposed surface of the buried bit line by a first recess process; forming an interlayer dielectric film on the etch stop film, the interlayer dielectric film including at least two layers having different etch selectivities; forming a lower pillar and an upper pillar by etching the interlayer dielectric film and the pillar in a direction crossing the buried bit line, the lower pillar protruding from the substrate in a vertical direction and extending in the first direction of the substrate, the upper pillar being disposed on the lower pillar and protruding in a second direction perpendicular to the first direction; exposing a portion of an outer side of the upper pillar by a second recess process; and forming a gate surrounding the outer side of the upper pillar and extending up to the recessed portion of the upper pillar.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2A:
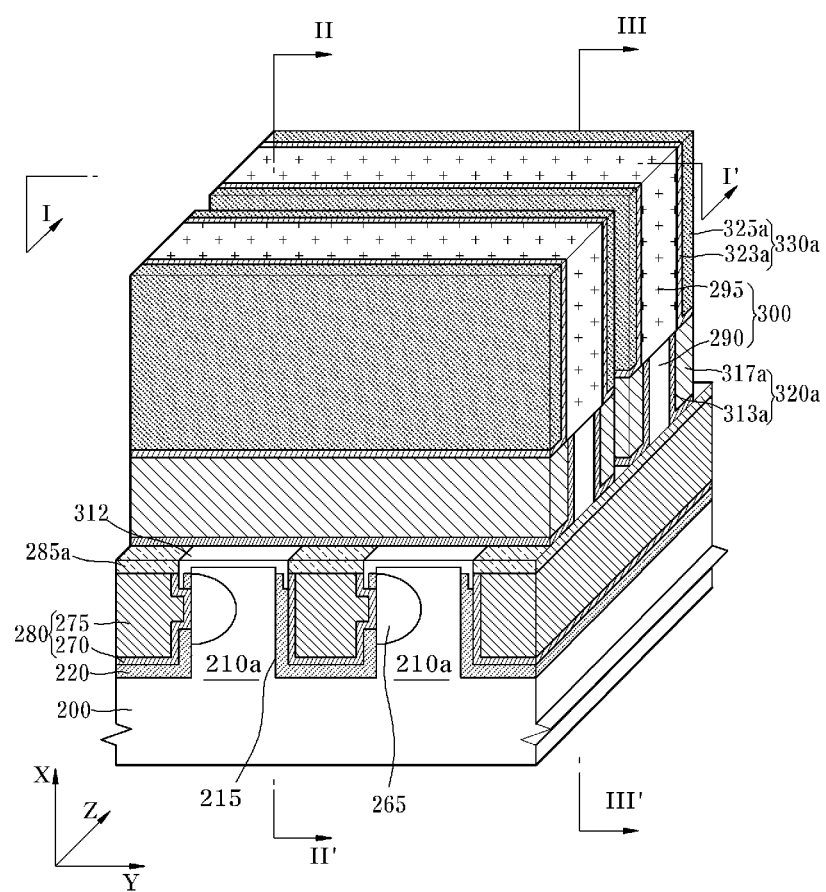
FIGS. 2A and 2B illustrate a semiconductor memory device according to an embodiment of the present invention.
Figure 2B:
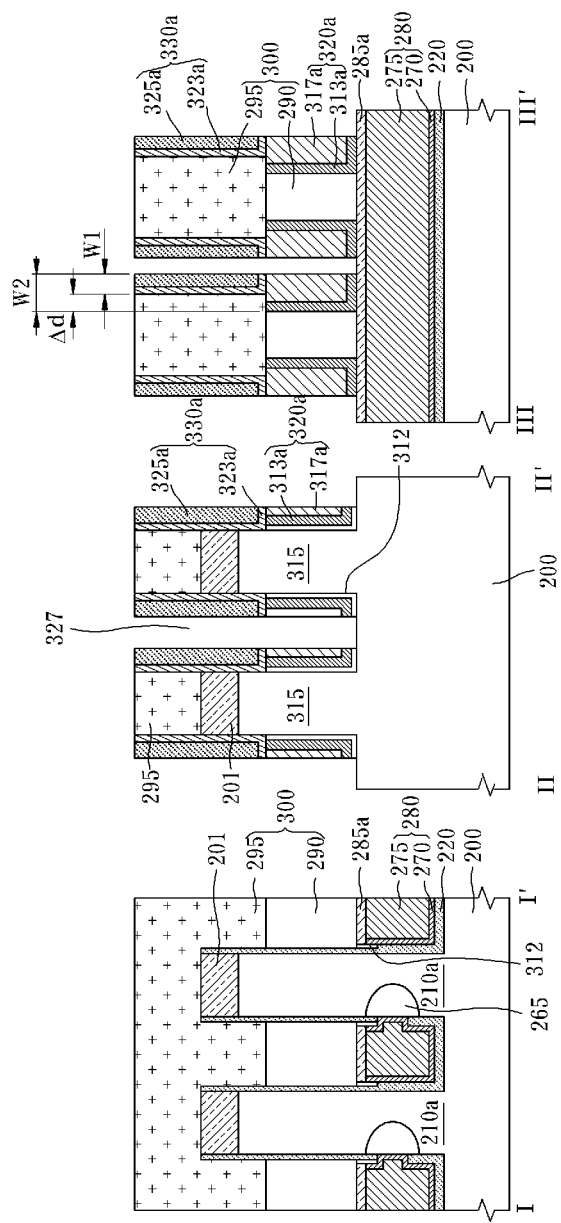

FIGS. 2A and 2B are views illustrating a semiconductor memory device according to an embodiment of the present invention.

Referring to FIGS. 2A and 2B, in a semiconductor device according to an embodiment of the present invention, first trenches 215 are formed along a first direction (e.g., the Z-direction) of a semiconductor substrate 200. Each first trench 215 is formed between two lower pillars 210a, which protrude upwardly in a second direction (e.g., the X-direction) and extend along the first direction (e.g., the Z-direction) of the semiconductor substrate 200. An upper pillar 315 protrudes upwardly in a second direction (e.g., the X-direction) perpendicular to the first direction (e.g., the Z-direction) over the lower pillars 210a extending along the first direction (e.g., the Z-direction). A drain region 265 being a buried bit line junction region is disposed at a lower portion of the lower pillar 210a. A first liner film 220 and a buried bit line 280 are disposed on the semiconductor substrate 200 at a lower portion of the first trench 215. The first liner 220 includes an oxide film. The buried bit line 280 fills a portion of the first trench 215 and contacts the drain region 265 which is the buried bit line junction region. An etch stop film 285a is disposed on the exposed surface of the buried bit line 280. An interlayer dielectric film 300 filling the remaining portion of the first trench 215 is disposed on the etch stop film 285a.

The interlayer dielectric film 300 includes two or more layers of insulating materials having different etch selectivities. The interlayer dielectric film 300 includes a first interlayer dielectric film 290, which is disposed at a lower portion of the stacked structure and recessed to expose a portion of an outer side of at least the upper pillar 315, and a second interlayer dielectric film 295, which is disposed at an upper portion of the stacked structure. The first interlayer dielectric film 290 is formed of an insulating material having a higher etch selectivity than the second interlayer dielectric film 295, and includes a spin on dielectric (SOD) film. The second interlayer dielectric film 295 includes a high density plasma (HDP) oxide film formed using an HDP process.

A gate 320a is provided in a line shape to surround the exposed outer side and the recessed portion of the upper pillar 315 and cross the buried bit line 280. The gate 320a has a structure in which a barrier metal pattern 313a and a gate metal pattern 317a are stacked on the gate dielectric film 312.

The buried bit line 280 includes a metal film, such as a titanium nitride (TiN) film or a tungsten (W) film. The etch stop film 285a is disposed between the buried bit line 280 and the gate 320a. The etch stop film 285a defines an isolated region having almost no impurities between the buried bit line junction region and a channel region. The thickness of the etch stop film 285a does not exceed 300 Å. Specifically, the etch stop film 285a may have a thickness ranging from approximately 50 Å to approximately 300 Å. On the side of the interlayer dielectric film 300, a spacer 330a is disposed to cover the exposed surface of the gate 320a. The spacer 330a has a structure in which a first spacer 323a and a second spacer 325a are stacked. The first spacer 323a and the second spacer 325a include a nitride film and an oxide film, respectively.

In order to control the gate 320a, a gate resistance should be small. The gate resistance is inversely proportional to a contact area contacting the active region. Hence, as the area of the gate contacting the active region increases, that is, the channel width increases, the gate resistance is reduced and therefore the control of the gate is facilitated.

Figure 1:
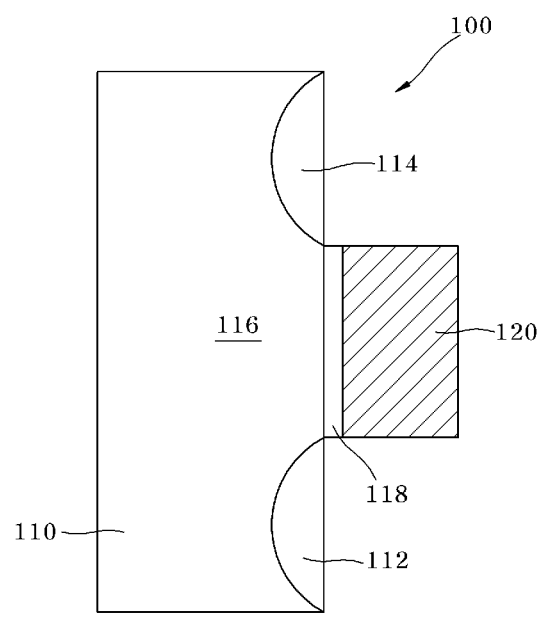
FIG. 1 illustrates a conventional vertical transistor.

In the conventional vertical transistor 100 shown in FIG. 1, however, the gate is formed on only the side of the upper pillar. Therefore, the channel width is limited to the width of the side of the upper pillar.

On the contrary, in the semiconductor memory device according to an embodiment of the present invention, the gate 320a extends to the width W1 of the outer side of the upper pillar 315 and the recessed portion (Δd) of the second interlayer dielectric film 295, and surrounds them. Thus, the channel width increases to "2(W1+Δd)."

The second interlayer dielectric film 295 may be recessed to expose the entire outer surface of the upper pillar 315. In this case, the channel region may be shaped to surround the entire exposed surface of the upper pillar 315, and the channel width may expand to the entire width of the upper pillar 315. Accordingly, the area of the gate contacting the active region may increase and the gate resistance may be reduced.

In addition, the isolated region in which impurities are not likely to exist may be defined at a thickness of 300 Å or less by the etch stop film 285a which is formed of an insulating film between the buried bit line 280 at a thickness of 300 Å or less. Therefore, it is possible to substantially prevent the operating current of the transistor from being lowered, as compared to the conventional vertical transistor 100 (see FIG. 1) which requires the isolated region of 500 Å or more.

FIGS. 3A to 19B are views illustrating a method for manufacturing a semiconductor memory device according to an embodiment of the present invention.

Figure 3A:
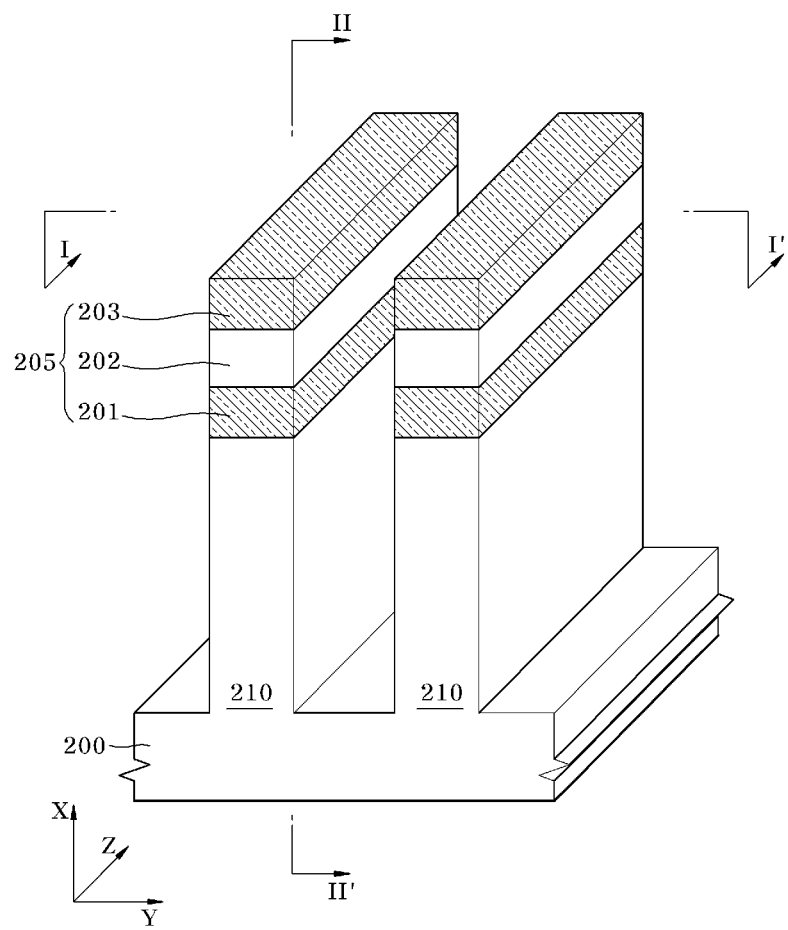
FIGS. 3A to 19B illustrate a method of manufacturing a semiconductor memory device according to an embodiment of the present invention.
Figure 3B:
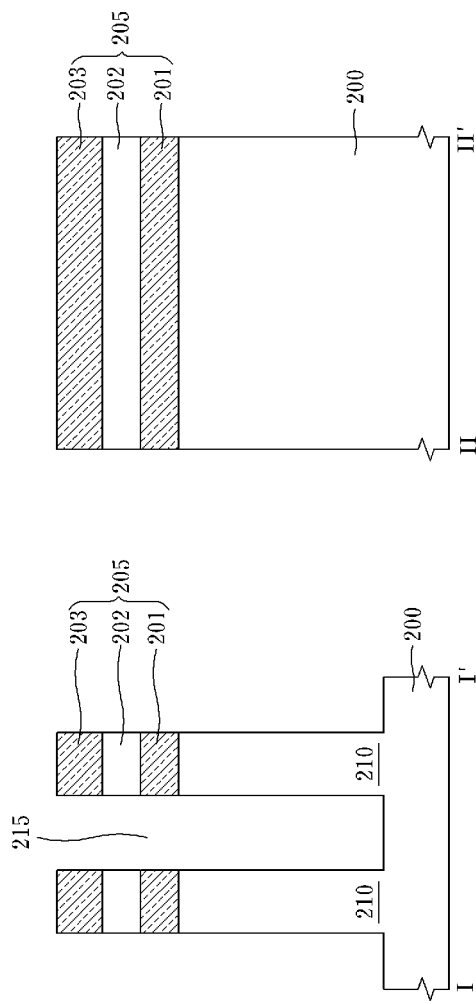

Referring to FIGS. 3A and 3B, a first trench 215 is formed within a semiconductor substrate 200. FIG. 3B are cross-sectional views taken along lines I-I' and II-II'. Specifically, a hard mask pattern 205 is formed on a semiconductor substrate 200. The hard mask pattern 205 selectively exposes the surface of the semiconductor substrate 200 in which a pillar 210 is to be formed. The hard mask pattern 205 may have a structure in which a first hard mask 201, a second hard mask 202, and a third hard mask 203 are stacked. The first hard mask 201 and the third hard mask 203 may be formed of a same material. In addition, the second hard mask 202 inserted between the first hard mask 201 and the third hard mask 203 may be formed of a material having a different etch selectivity than those of the first and third hard masks 201 and 203. In this embodiment, the first and third hard masks 201 and 203 may include a nitride film, and the second hard mask 202 may include an oxide film. The second hard mask 202 will serve as an etch stop film due to the different etch selectivity from those of the first and third hard masks 201 and 203.

The first trench 215 is formed within the semiconductor substrate 200 by etching the exposed portion of the semiconductor substrate 200 by a predetermined depth using the hard mask pattern 205 as an etch mask. The first trench 215 defines a pillar 210 in which a vertical transistor is to be formed in the semiconductor substrate 200, and also separates one pillar 210 from an adjacent pillar 210. Accordingly, the pillars 210 are formed to protrude upward from the semiconductor substrate 200 on both sides of the first trench 215. The height of the pillar 210 is determined according to the depth of the first trench 215. The first trench 215 as shown in FIG. 3A extends along the Z-direction of the semiconductor substrate 200.

Figure 4A:
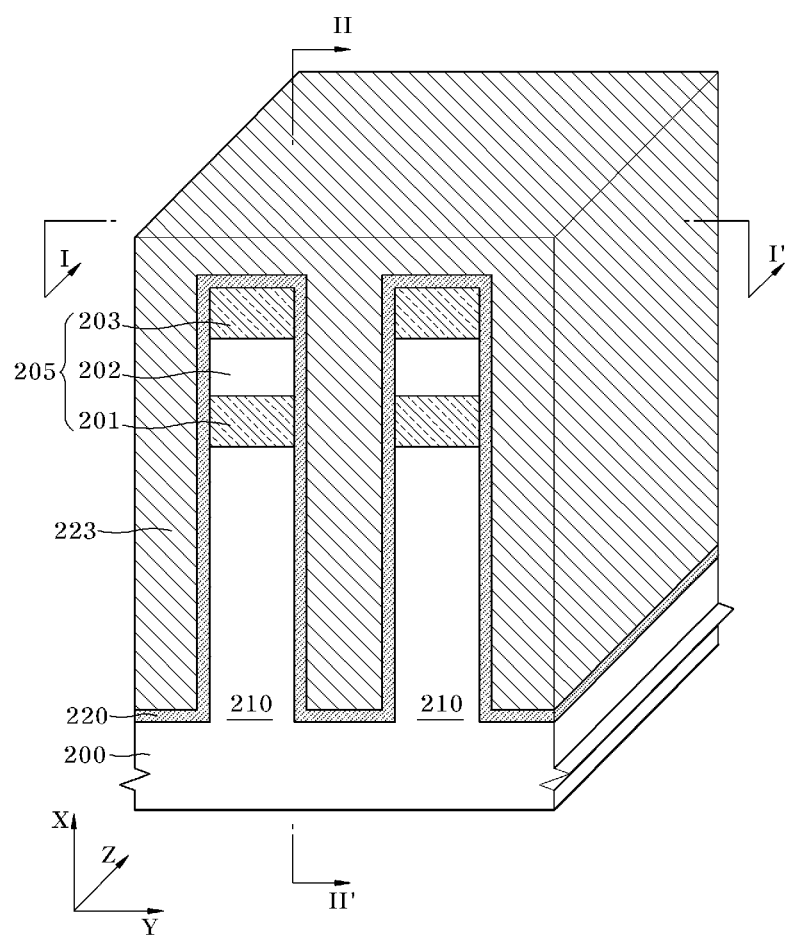
Figure 4B:
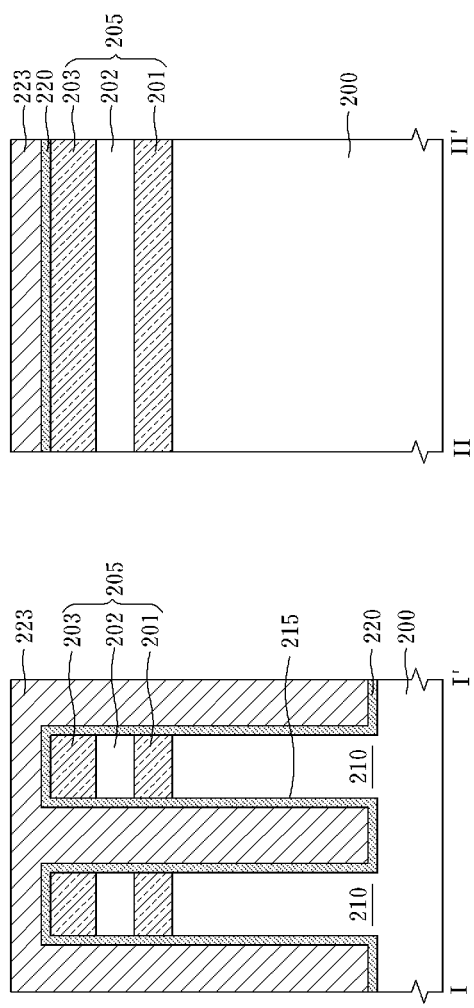

Referring to FIGS. 4A and 4B, a first liner film 220 is formed on the semiconductor substrate 200 formed with the first trenches (215 in FIG. 3A) and pillars 210. The first liner film 220 may be formed using an oxide film. The first trench 215 with the first liner film 220 formed thereon is filled with a first sacrificial film 223. The first sacrificial film 223 is formed with a material having an etch selectivity to the first liner film 220 and may include an undoped polysilicon film. The first sacrificial film 223 serves to selectively expose a region, in which an opened portion of a drain region is to be formed.

Figure 5A:
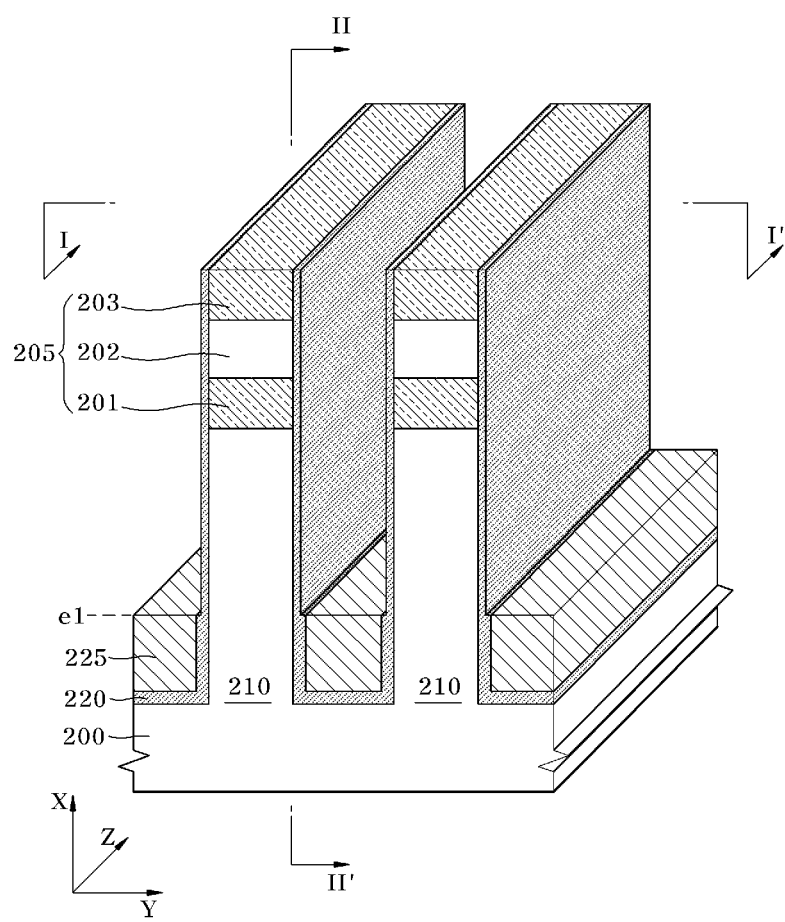
Figure 5B:
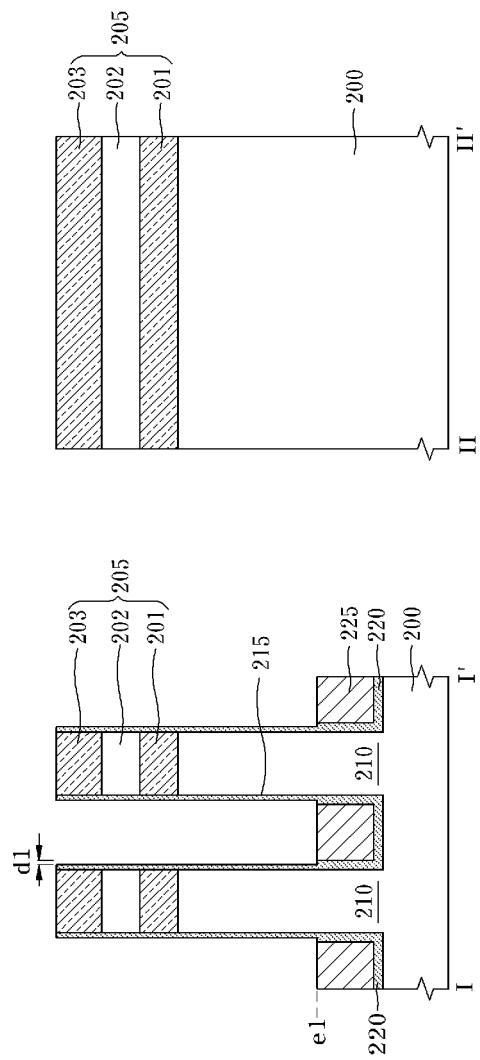

Referring to FIGS. 5A and 5B, the first sacrificial film 223 as labeled in FIG. 4A is recessed to form the first sacrificial film, which is now labeled with 225 in FIG. 5A, to fill a lower portion of the first trench 215. An etch process is performed on the first sacrificial film 223 of FIG. 4A that completely filled the first trench 215, so that the resulting first sacrificial film (labeled as 225 in FIG. 5A) is recessed to a first position e1 at a lower portion of the first trench 215. The etch process may be an etch-back process. In some cases, the sacrificial film may be planarized before the etch-back process. In the process of etching back the first sacrificial film 223 in FIG. 4A to the recessed first sacrificial film 225 in FIG. 5A, the surface portions of the first liner film 220 covering each sidewall of the pillars 210 having the hard mask pattern 205 thereon is removed by a first thickness d1 (see FIG. 5B). For example, the thickness of the first liner film 220 reduced in thickness by d1 could be half or less than half the thickness of the first liner film 220 prior to the etch back. The portions of the first liner film 220 formed on top of the hard mask pattern 205 of each pillar 210 are removed.

Figure 6A:
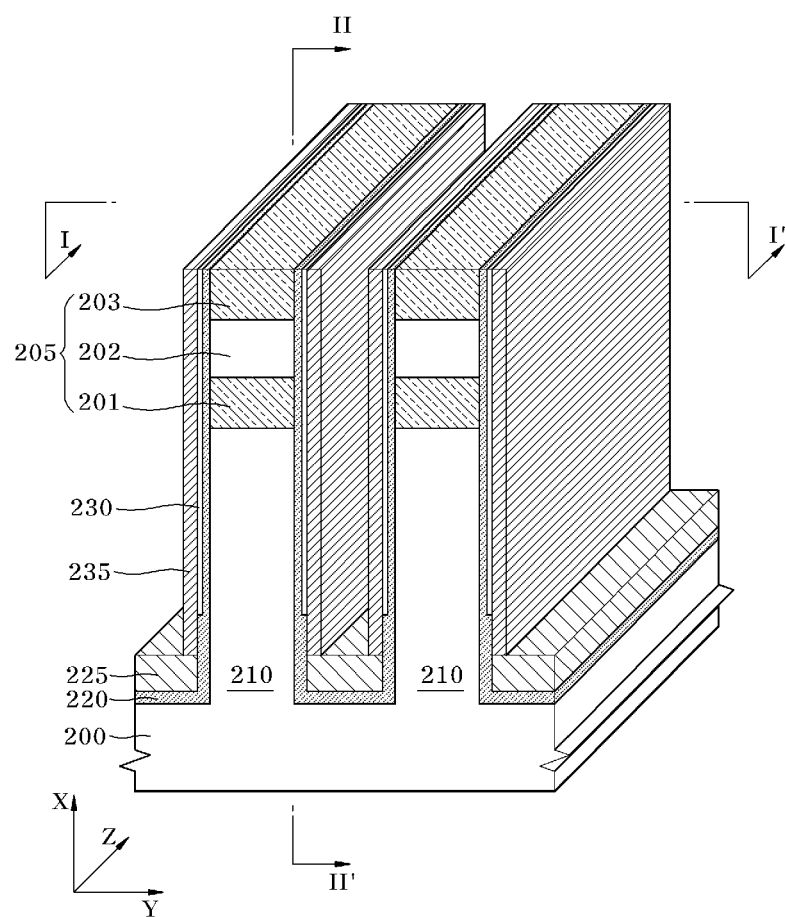
Figure 6B:
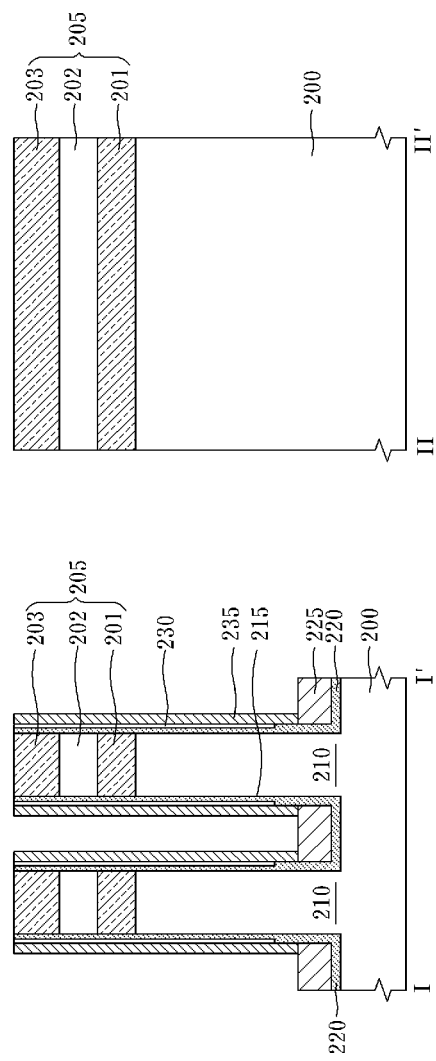

Referring to FIGS. 6A and 6B, a second liner film 230 is formed on the portions of the first liner film 220 that were removed by the first thickness d1 in FIG. 5B. The second liner film 230 is formed in a spacer shape and is formed of a material having a sufficient etch selectivity so that the first liner film 220 can be selectively etched. That is, in a later etching process on the first liner film 220, the influence on the second liner film 230 should be minimized. For example, if the first liner film 220 is formed by using an oxide film, the second liner film 230 may be formed by using a nitride film.

In the etch process performed to form the second liner film 230 in a spacer shape, the first sacrificial film 225 that has been recessed to the first position of e1 (see FIG. 5B) is additionally recessed, and the portions of the sidewall of the first liner film 220 that were not reduced in thickness by d1 are partially exposed. Then, a barrier film 235 is formed on the second liner film 230 and the first liner film 220 that were exposed in each of the first trenches 215 as shown in FIGS. 6A-6B. The barrier film 235 is formed in a spacer shape by using a material having an etch selectivity to the first liner film 220 and the second liner film 230, for example, a titanium nitride (TiN) film. The barrier film 235 serves to protect the side of the pillar 210 in a subsequent etch process. In order to form the barrier film 235 in a spacer shape, the barrier film 235 is formed to extend along the exposed surfaces of the first liner film 220, the second liner film 230, and the first sacrificial film 225, and the barrier film 235 is etched to remain on only the side of the pillar 210. Accordingly, the surface of the first sacrificial film 225 is partially exposed.

Figure 7A:
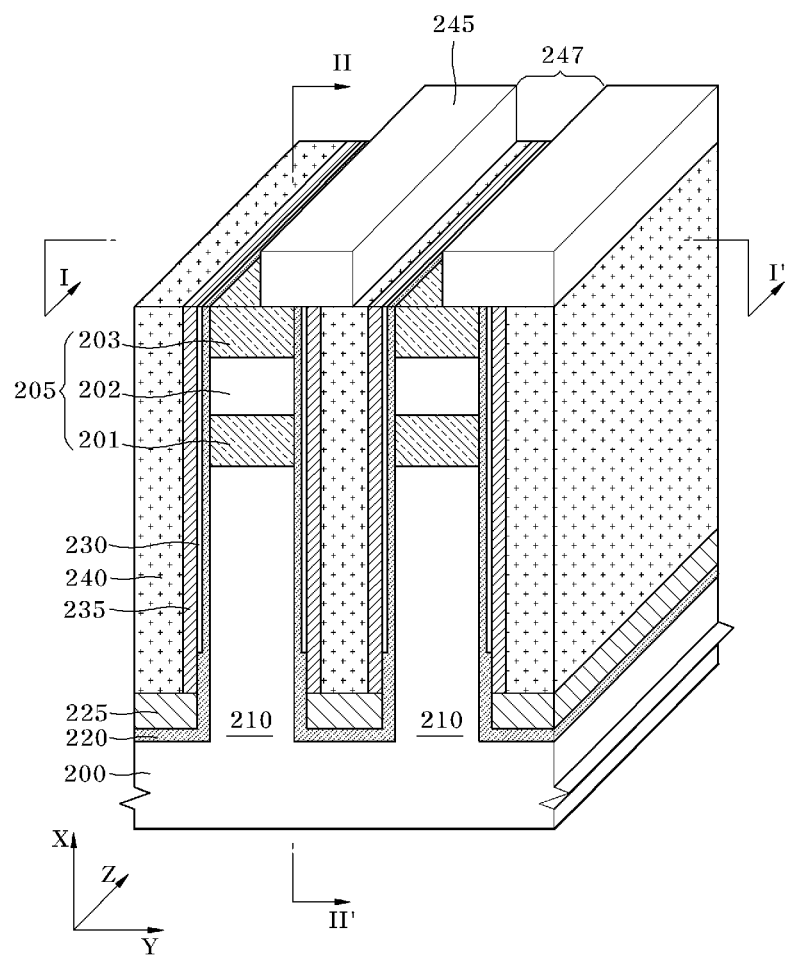
Figure 7B:
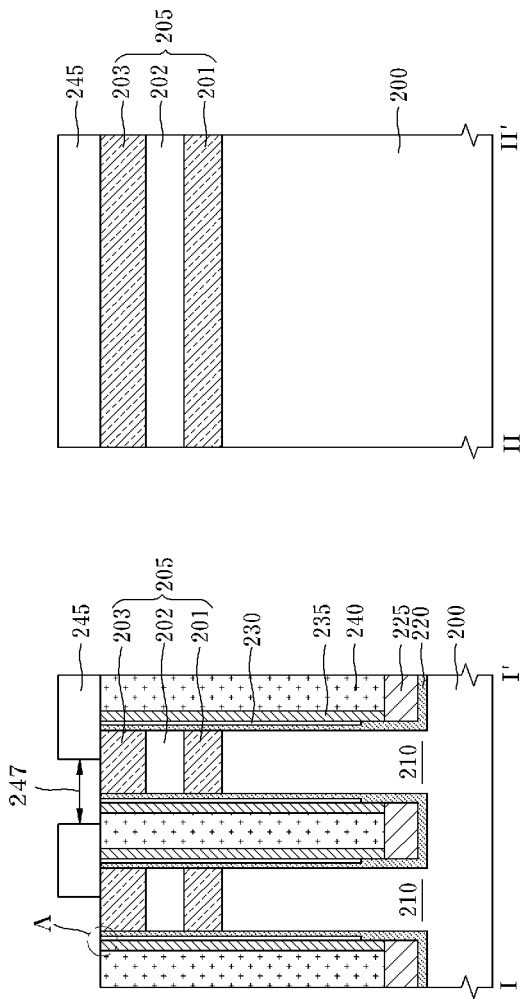

Referring to FIGS. 7A and 7B, a second sacrificial film 240 is formed to fill the first trench 215 in which the barrier film 235 is formed along a sidewall surface of the pillar 210. The second sacrificial film 240 fills only the inside of the first trench 215. The first sacrificial film 225 is entirely buried on the semiconductor substrate 200, and the inside of the first trench 215 is filled by performing a planarization process on the second sacrificial film 240. The second sacrificial film 240 may be formed of the same material as the first liner film 220. Accordingly, in a subsequent etch process of removing the barrier film 235, the second sacrificial film 240 would not be influenced by the etching.

A mask pattern 245 is formed on the second sacrificial film 240 and the mask pattern 205 in order to selectively remove the barrier film 235. The mask pattern 245 may include a photoresist film. The mask pattern 245 is formed to have an opening 247 which exposes the barrier film 235, the second liner film 230, and the first liner film 220 formed on the first side of the pillar 210 (see "A" in FIG. 7B), but the mask pattern 245 is formed to cover the barrier film 235, the second liner film 230, and the first liner film 220 formed on the second side of the pillar 210, that is, the barrier film 235 formed on the second side which should not be removed. The side of the pillar 210 that is exposed by the opening of the mask pattern 245 is referred as "the first side," and the side that is covered under the mask pattern 245 is referred to as "the second side" in the present disclosure below.

Figure 8A:
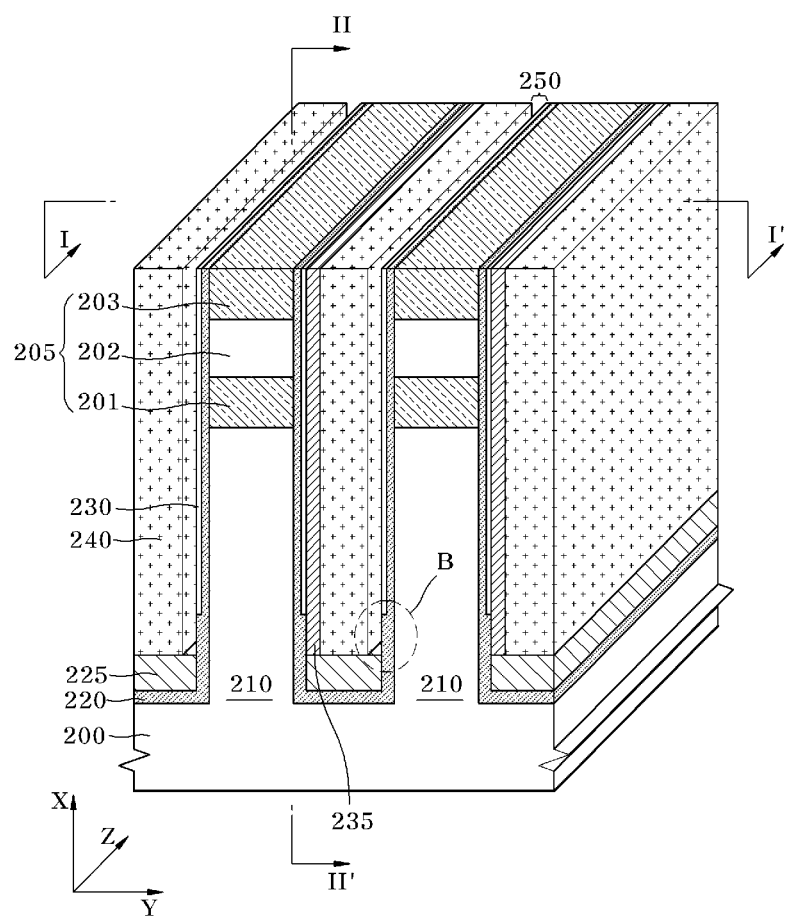
Figure 8B:
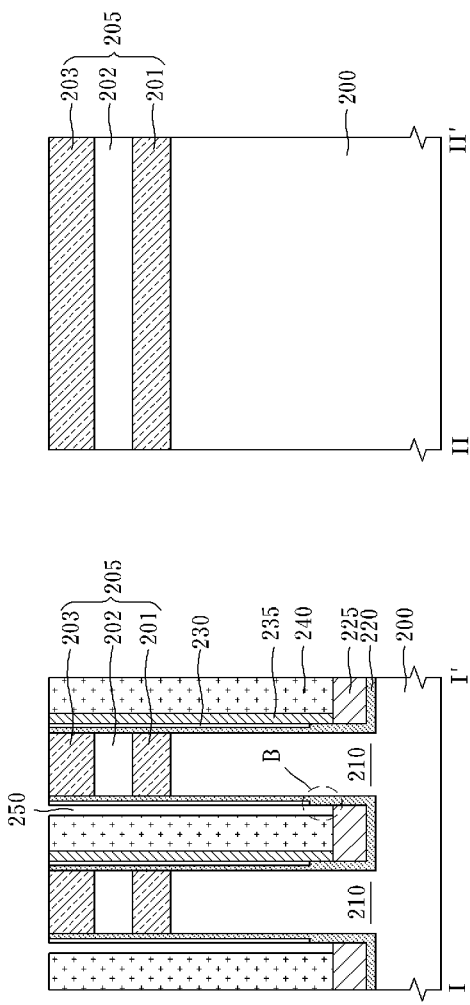

Referring to FIGS. 8A and 8B, the first liner film 220 on the first side of the pillar 210 near the bottom of the first trench 215 is exposed by removing the barrier film 235 in FIGS. 7A-7B of the first side exposed by the mask pattern 245 in FIGS. 7A-7B. This process may be performed using a wet etch process. In the process of removing the barrier film 235 of the first side, since the second sacrificial film 240 is formed of a sufficient etch selectivity to the barrier film 235, the second sacrificial film 240 is not significantly influenced by the etching. Accordingly, the barrier film 235 of the second side covered by the second sacrificial film 240 is not removed. Then, the mask pattern 245 is removed. Since the barrier film 235 of the first side is selectively removed, an empty space 250 is formed in the first trench 215. The first liner film 220 contacting the first side disposed at the lower portion of the pillar 210, that is, the opened portion of the drain region, is exposed through the empty space 250 (see "B" in FIG. 8B).

Figure 9A:
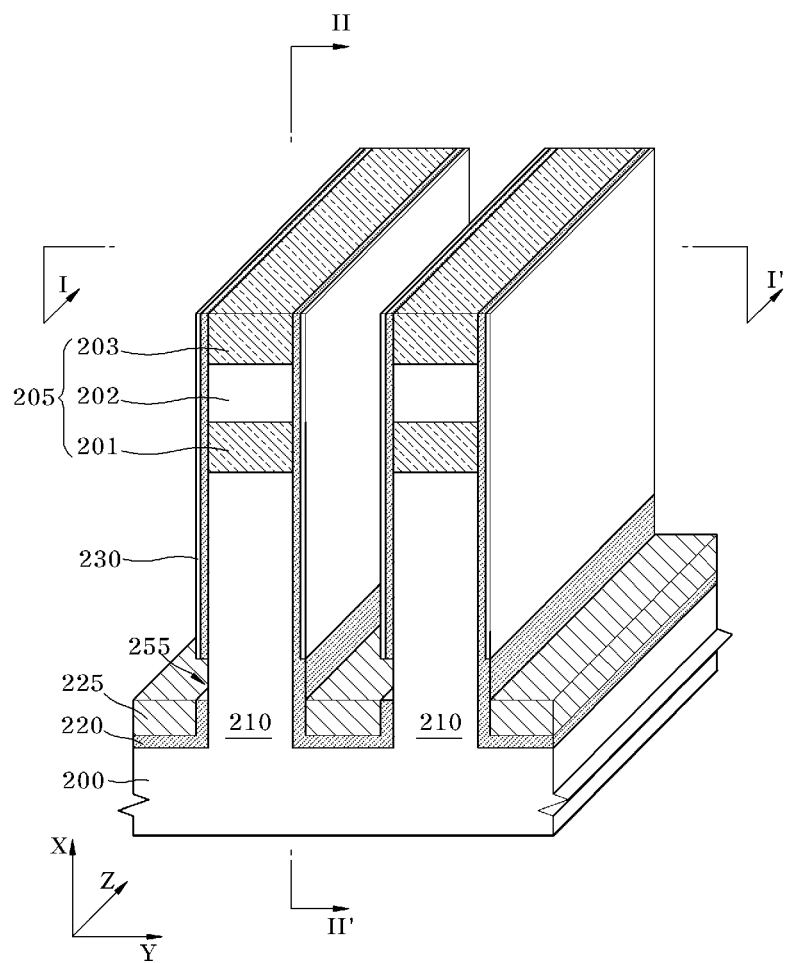
Figure 9B:
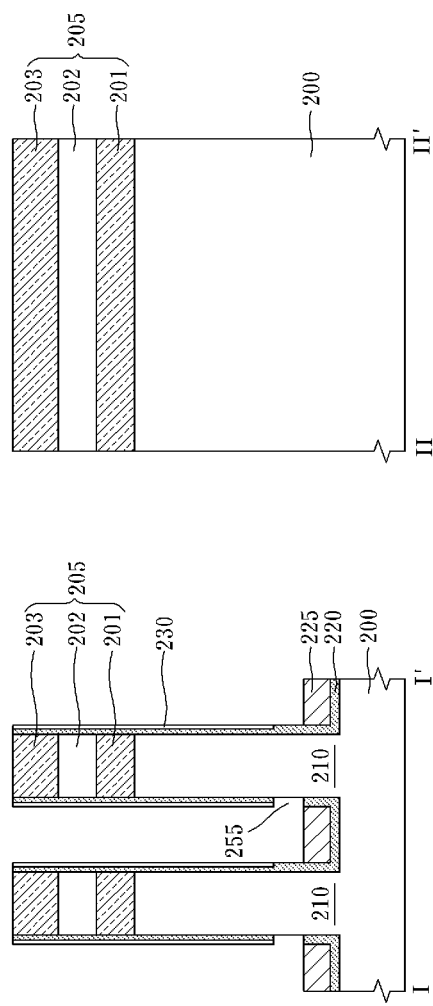

Referring to FIGS. 9A and 9B, the second sacrificial film 240 (shown in FIG. 8B) is removed. Since the second sacrificial film 240 and the first liner film 220 are formed of the same material, the exposed portion B (shown in FIG. 8B) of the first liner film 220 is also removed in the process of removing the second sacrificial film 240. By removing the exposed portion B of the first liner film 220, a portion 255 of the pillar 210 on the first side is also exposed, and this exposed portion 255 of the pillar 210 also becomes the opened portion 255 of the drain region. A wet etch process may be performed to remove the second sacrificial film 240 and the exposed portion B of the first liner film 220.

Figure 10A:
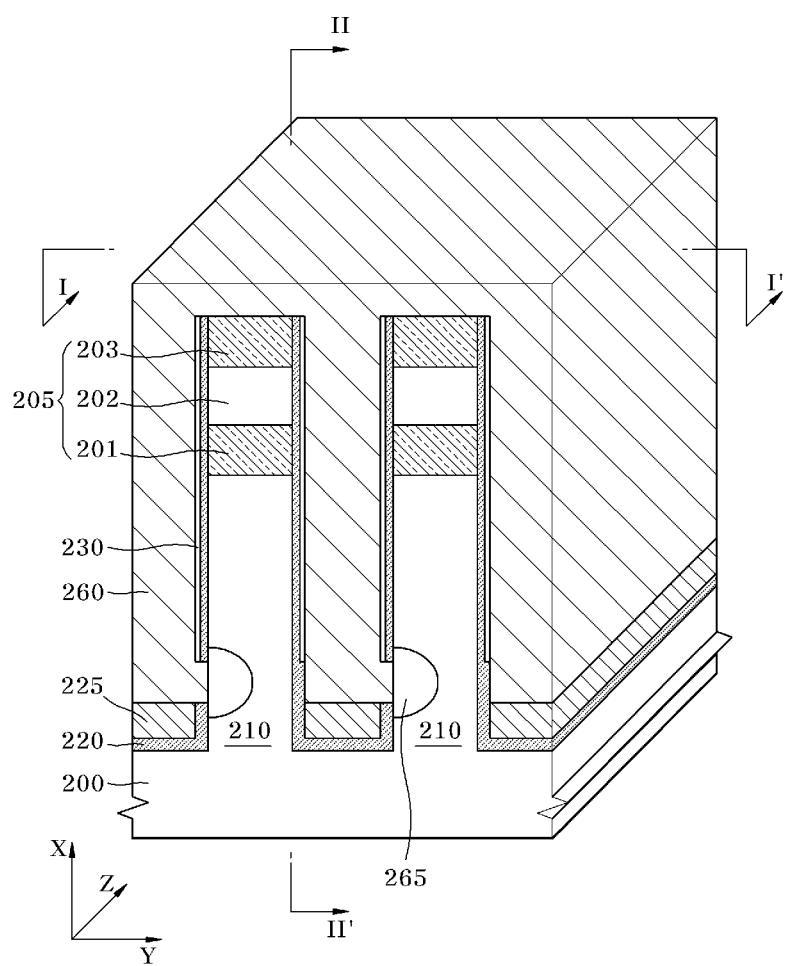

Referring to FIGS. 10A and 10B, a conductive film 260 is deposited in the first trenches 215 and over the pillars 210 of the semiconductor substrate 200. The conductive film 260 is deposited in each of the first trenches 215 so as to contact the corresponding pillar 210 through the opened portion 255 (shown in FIGS. 9A-9B) of the drain region. The conductive film 260 may be formed using a doped polysilicon film. The conductive film 260 is formed to directly contact the opened portion 255 (in FIG. 9A-9B) of the drain region. The conductive film 260 is deposited along the region where the first liner film 220, the second liner film 230, and the opened portion 255 of the drain region are exposed. The conductive film 260 may be formed sufficiently thick that it can directly contact the opened portion 255 of the drain region. The conductive film 260 may be formed after removal of the first sacrificial film 225 (shown in FIGS. 8A and 8B). Then, the impurity ions in the conductive film 260 such as a doped polysilicon film are diffused into the pillar 210 through the open portion 255 by a thermal treatment, thereby forming a drain region 265, that is, a buried bit line junction region.

Figure 11A:
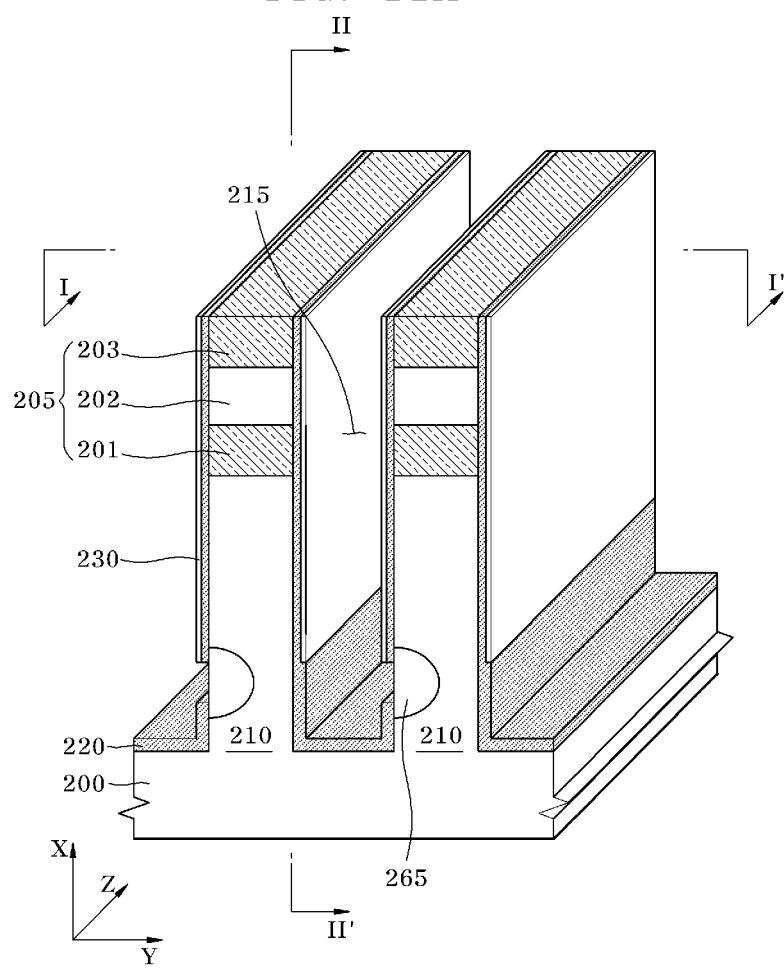
Figure 11B:
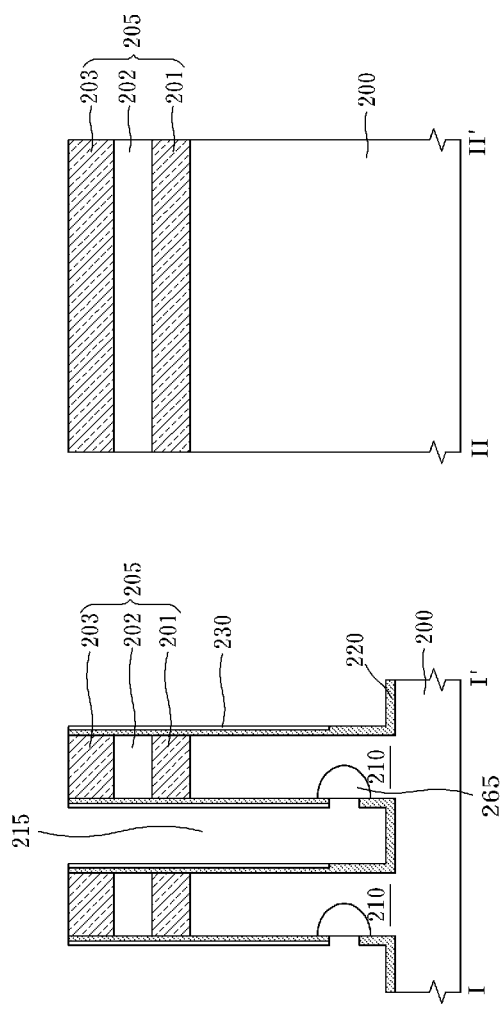

Referring to FIGS. 11A and 11B, the drain region 265 and the bottom of the first trench 215 covered by the first liner film 220 are exposed by removing the conductive film 260 (shown in FIGS. 10A and 10B). The etching for removing the conductive film 260 may be performed using a wet etch process while supplying etch gas removing the polysilicon film. While removing the conductive film 260, the first sacrificial film 225 disposed at the lower portion of the first trench 215 and having the same etch rate as the conductive film 260 is also removed. Due to the removal of the conductive film 260 and the first sacrificial film 225, the surfaces of the first liner film 220 and the second liner film 230 and the drain region 265 are exposed.

Figure 12A:
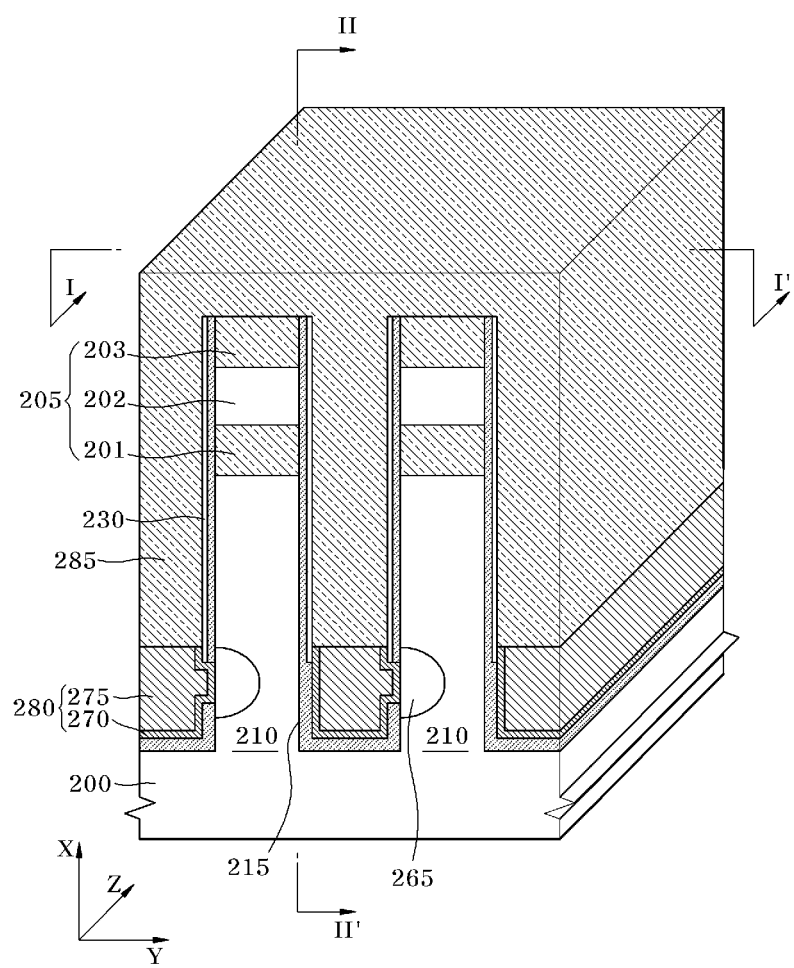
Figure 12B:
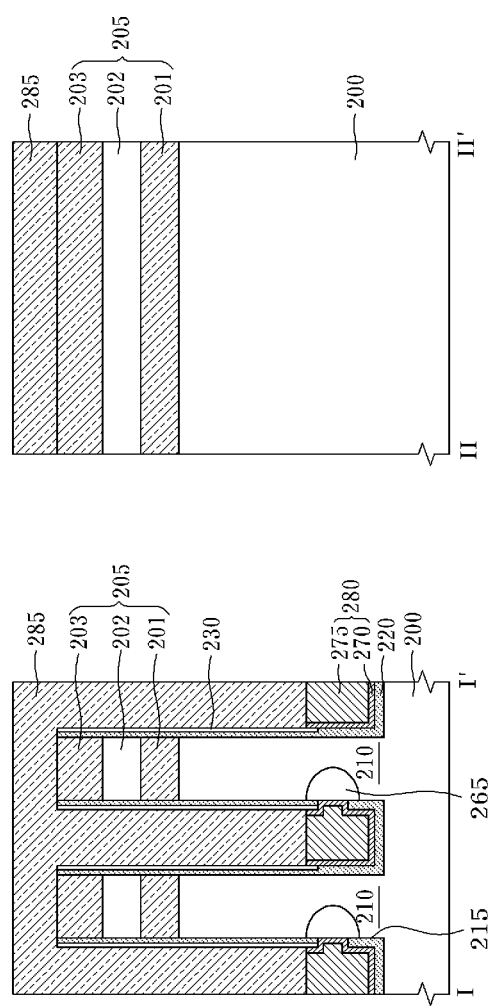

Referring to FIGS. 12A and 12B, a buried bit line 280 filling a bottom portion of the first trench 215 is formed. In forming the buried bit line 280, a barrier metal film 270 and a metal film 275 are sequentially deposited over the semiconductor substrate 200. The barrier metal film 270 may be formed in a single layer structure comprising a titanium (Ti) film or a titanium nitride (TiN) or the like material or a multilayer structure comprising multiple layers of titanium film, titanium nitride, etc. The metal film 275 may include a tungsten (W) film. The barrier metal film 270 is deposited to contact the exposed portion 255 of the drain region 265. The barrier metal film 270 and the metal film 275 are recessed to a predetermined thickness in the first trench 215 so that a predetermine portion of the metal film 275 would remain in the first trench 215. Accordingly, a buried bit line 280 filling a portion of the first trench 215 is formed. As shown in FIG. 12A, the buried bit line 280 is formed to extend in a Z-direction of the semiconductor substrate 200. The barrier metal film 270 and the metal film 275 are recessed in the first trench 215 so that the top surface of the recessed buried bit line 280 would be about equal to or not less than the upper portion of the drain region 265. In certain cases, a planarization process may be performed prior to recessing the barrier metal film 270 and the metal film 275.

The first trench 215 having the buried bit line 280 at a lower portion is filled with an insulating film 285. The insulating film 285 may be formed of the same material as the first and third hard masks 201 and 203. Accordingly, the insulating film 285 is formed of an insulating material. The insulating film 285 is formed to a sufficient thickness to fill the first trench 215 and cover the third hard mask 203. If the insulting film 285 is not formed sufficiently thick so as to fill up over the third mask 203, the insulating films may all be removed in a subsequent etch-back process that would be performed for ensuring a region where a gate is to be formed. This may consequently expose the surface of the buried bit line 280 such that the buried bit line 280 may not be separated from the gate, thereby degrading the electrical operation characteristic of the gate. Therefore, the insulating film 285 is formed sufficiently thick so as to fill the first trench 215 and to cover over the third hard mask 203.

Figure 13A:
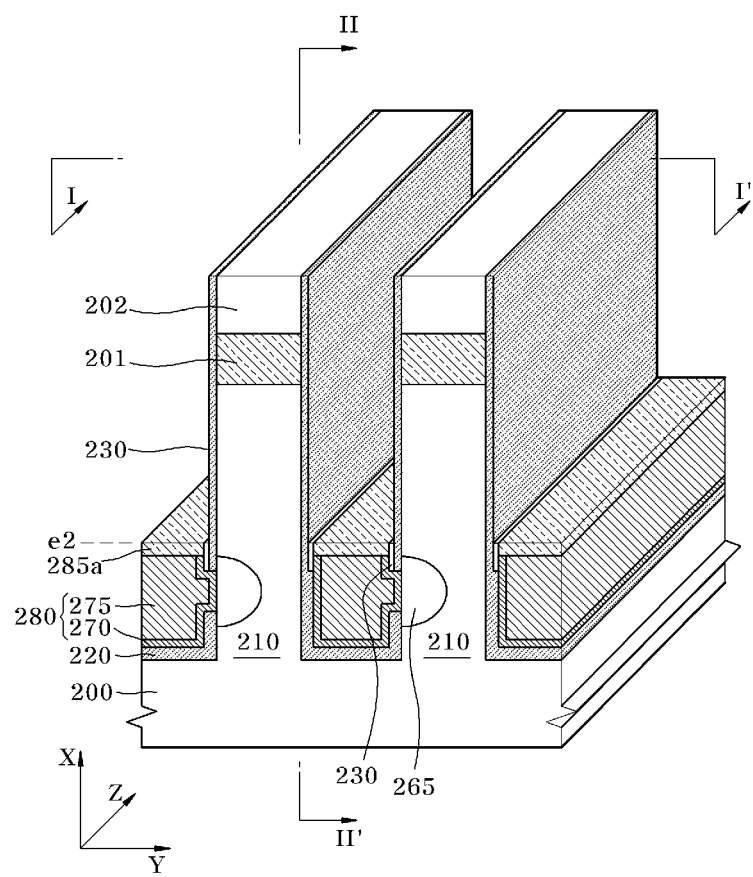
Figure 13B:
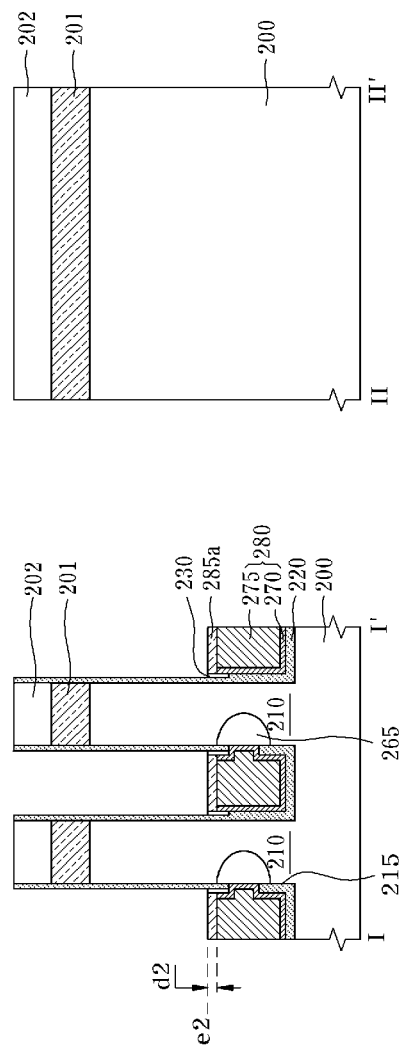

Referring to FIGS. 13A and 13B, an etch stop film 285a having a second thickness d2 is formed by recessing the insulating film 285 shown in FIG. 12B. That is, the insulating film 285 is recessed to a second position e2 in the first trench 215 by performing an etch process on the insulating film 285. The etch process may be performed using an etch-back process. In certain cases, a planarization process may be performed on the insulating film 285 before performing the etch-back process. The second liner film 230 and the insulating film 285 are formed of a same material such that, when the etch-back process is performed to recess the insulating film 285 to the second position e2 in the first trench 215, the portion of the second liner film 230 disposed above the second position e2 on the sidewall of the pillar 210 in the first trench 215 is also removed. As a result, the first liner film 220 above the second position e2 is exposed in the first trench 215. In addition, the third hard mask 203 shown in FIG. 12B also formed of the same material as the insulating film 285 is removed as well, and, as a result, the surface of the second hard mask 202 of the pillar 210 is exposed. The first hard mask 201 is not influenced by the etch process, because the etch selectivities of the first liner film 220 and the second hard mask 202 surrounding the first hard mask 201 are different from the etch selectivity of the insulating film 285. The etch process of recessing the insulating film 285 in the first trench 215 continues for a period of time until the surface of the second hard mask 202 on the pillar 210 is exposed. By the time the etch process is stopped after exposing the second hard mask 202 on the pillar 210, the insulating film 285 in the first trench 215 would not be completely removed, and, as a result, the etch stop film 285a having a second thickness d2 of, for example, approximately 50 Å to approximately 300 Å, remains on the buried bit line 280 in the first trench 215. The etch stop film 285a of thickness d2 remaining on the buried bit line 280 in the first trench 215 then serves as an end point of a subsequent etch process.

It is noted that the etch-back process for forming the buried bit line 280 and the subsequent gate etch process are performed based on adjusted time periods for etching with no separate end point. Then, a buffer region is necessarily required in order to prevent an electrical short between the buried bit line 280 and the gate to be formed. In the conventional art, the thickness of such a buffer region is maintained to be 500 Å or more, in consideration of the process margins required in the metal film etch-back process for forming a buried bit line and the gate etch process for forming a gate. However, when the thickness of the buffer region is 500 Å or more, it will increase the width of the isolated region, in which impurities are least likely to exist between the channel region and the bit line junction region. With increased width of the isolated region, the current characteristic of the transistor is significantly degraded. In particular, the on-current of the semiconductor memory device is significantly reduced. That is, on one hand, it would seem desirable to have the distance between the buried bit line and the gate be wide in view of the limitations imposed by the process margins. On the other hand, for purposes of securing the sufficient on-current characteristics, the distance between the buried bit line and the gate should be narrow. Overcoming the limitations imposed by the process margins and securing the sufficient on-current characteristics are in a tradeoff relationship.

Therefore, in an embodiment of the present invention, as the etch stop film 285a is disposed on the buried bit line 280 (by recessing the insulating film 285 in the first trench 215), the top surface position of the etch stop film 285a (such as the second position e2 shown in FIG. 13A) has only to be designated as the end point. This allows the reduction of thickness of the buffer region to anywhere from approximately 50 Å to approximately 300 Å, which is less than 500 Å required in the conventional art. The depth of the isolated region formed by the setting of the buffer region is also reduced to approximately 50 Å to approximately 300 Å, which is equal to the second thickness d2 of the etch stop film 285a. Thus, it prevents the reduction of on-current caused by the increased width of the isolated region.

Figure 14A:
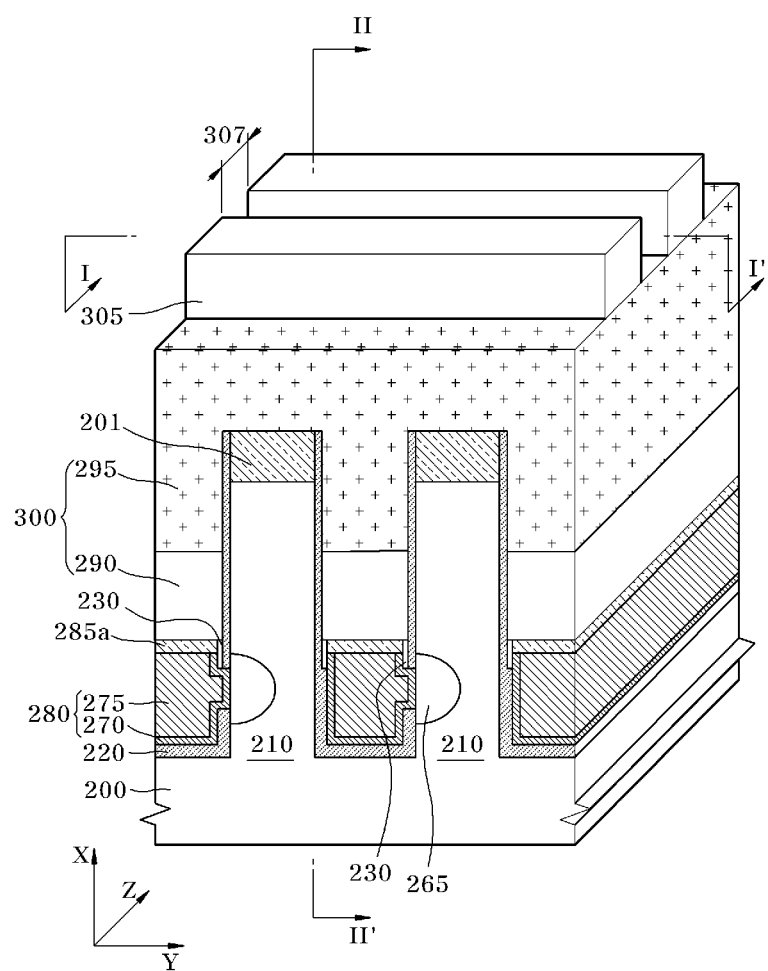
Figure 14B:
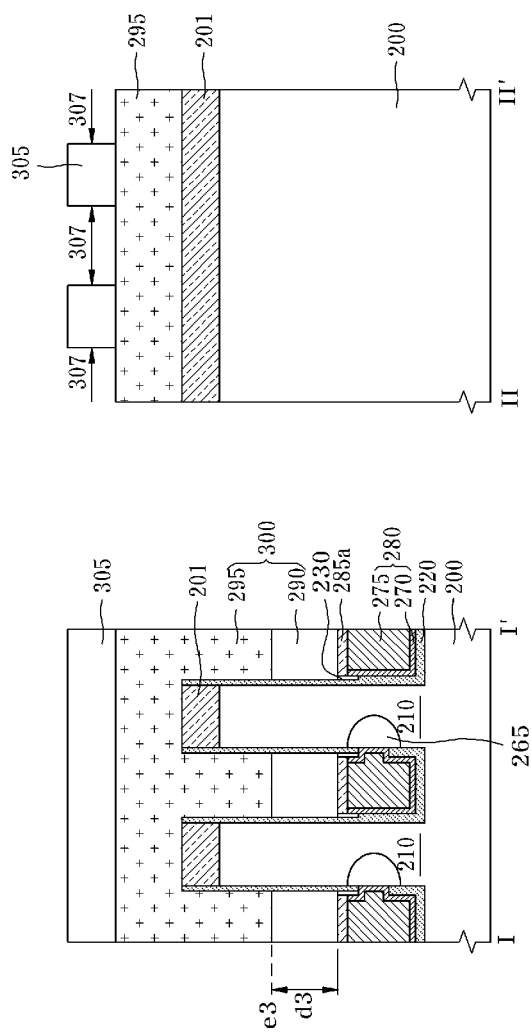

Referring to FIGS. 14A and 14B, an interlayer dielectric film 300 is formed on the etch stop film 285a formed on the buried bit line 280. The interlayer dielectric film 300 is formed in a structure of at least two stacked layers of insulating materials having etch selectivities different from each other. According to an embodiment as shown in FIGS. 14A-14B, the interlayer dielectric film 300 includes a first interlayer dielectric film 290 formed under a second interlayer dielectric film 295 having a lower etch selectivity than the etch selectivity of the first interlayer dielectric film 290. The first interlayer dielectric film 290 may include an SOD film, and the second interlayer dielectric film 295 may include an HDP oxide film formed using an HDP process. For example, an SOD film for the first interlayer dielectric film 290 is formed over the semiconductor substrate 200 in the first trenches 215 over the first liner film 220 and over the second hard mask 202 shown in FIG. 13A. The SOD film may be formed using a spin coating process. The SOD film is formed to a thickness so as to sufficiently fill over the first liner film 220 and the second hard mask 202.

The surface of the SOD film may be polished using a planarization process and is subjected to an etch process, for example, a wet etch process, to recess the SOD film up to a third position e3, thereby forming the first interlayer dielectric film 290 having a thickness d3. The thickness d3 of the recessed SOD film, that is, the first interlayer dielectric film 290, is equal to the height of a gate which is to be formed. During the process of recessing the SOD film, the second hard mask 202 shown in FIG. 13B formed of an oxide film and the portions of the first liner 220 on the sidewalls of the second hard mask 202 are also etched and removed by the wet etch source. As a result, the surface of the first hard mask 201 is exposed.

The second interlayer dielectric film 295 including an HDP oxide film is formed by performing an HDP process on the first interlayer dielectric film 290 of a recessed SOD film. The HDP process includes a deposition process of depositing an HDP oxide film to a predetermined thickness by supplying an HDP deposition gas containing a silane ($SiH_4$) gas, and an etch process of removing overhang caused during the deposition process by supplying an etch gas. By repeating the HDP processes, the interlayer dielectric film 300 including the SOD film and the HDP oxide film stacked thereon is formed.

A resist pattern 305 defining a gate region is formed on the interlayer dielectric film 300. The resist pattern 305 has an opening 307 selectively exposing the surface of the interlayer dielectric film 300. The resist pattern 305 is formed in a Y-direction of the semiconductor substrate 200, that is, a direction crossing the buried bit line 280 extending in a Z-direction of the semiconductor substrate 200.

Figure 15A:
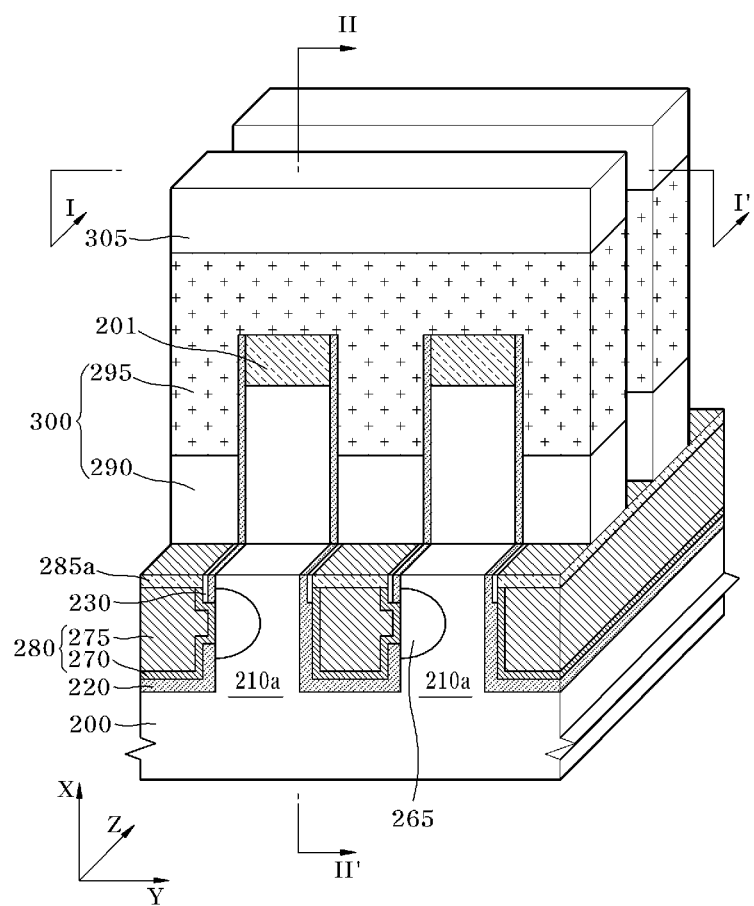
Figure 15B:
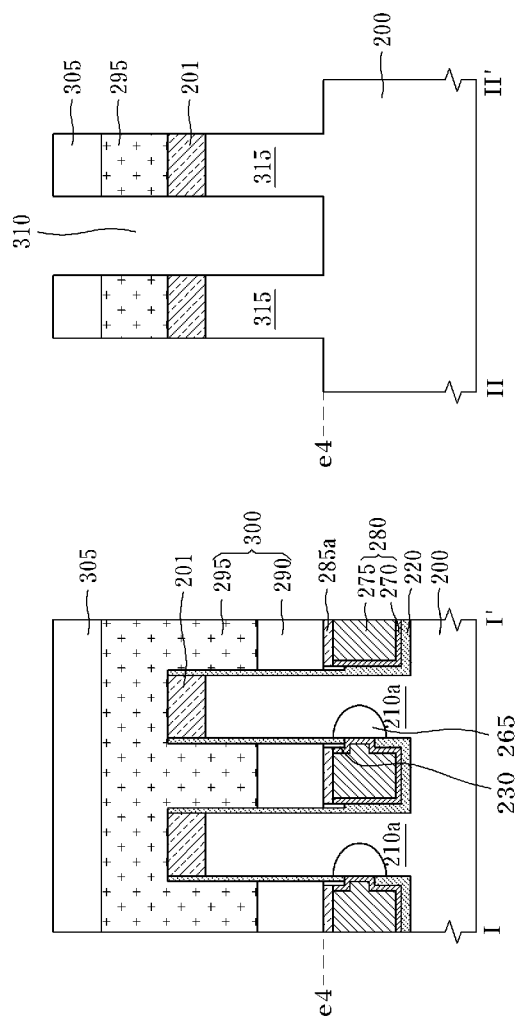

Referring to FIGS. 15A and 15B, an etch process using the resist pattern 305 as an etch mask is performed to etch the interlayer dielectric film 300, the first mask pattern 201, the first liner film 220, and the semiconductor substrate 200, all of which are exposed by the opening 307, to a predetermined depth. As illustrated in FIG. 15B showing the cross-sectional view taken along line II-II' of FIG. 15A, a second trench 310 is formed over the semiconductor substrate 200. As a result of the etching of the original structure of the pillar 210 as shown in FIG. 14A in the Y-direction using the resist pattern 305 as an etch mask, a lower pillar 210a and an upper pillar 315 are then formed, which are shown in FIGS. 15A-15B. The lower pillar 210a protrudes upwardly (i.e., in the X-direction) from the semiconductor substrate 200 and extends in the Z-direction of the semiconductor substrate 200. The upper pillar 315 is disposed on a portion of the lower pillar 210a corresponding to the portion under the resist pattern 305 that has not been etched, and the upper pillar 315 protrudes upwardly in the X-direction perpendicular to the Z-direction. The adjacent upper pillars 315, in which the gates are to be formed, are separated by a second trench 310. The height of the upper pillar 315 is determined according to the depth of the second trench 310. That is, the upper pillar 315 can be formed as high as any desired height of the gate to be formed. As the etch process is performed in the Y-direction of the semiconductor substrate 200, the surface of the lower pillar 210a is exposed in the second trench 310. The etch process for forming the second trench 310 is stopped at a position e4 where the etch stop film 285a is exposed, because the etch stop film 285a having a different etch selectivity from the interlayer dielectric film 300 covering the surface of the 280 serves as an etch barrier.

Figure 16A:
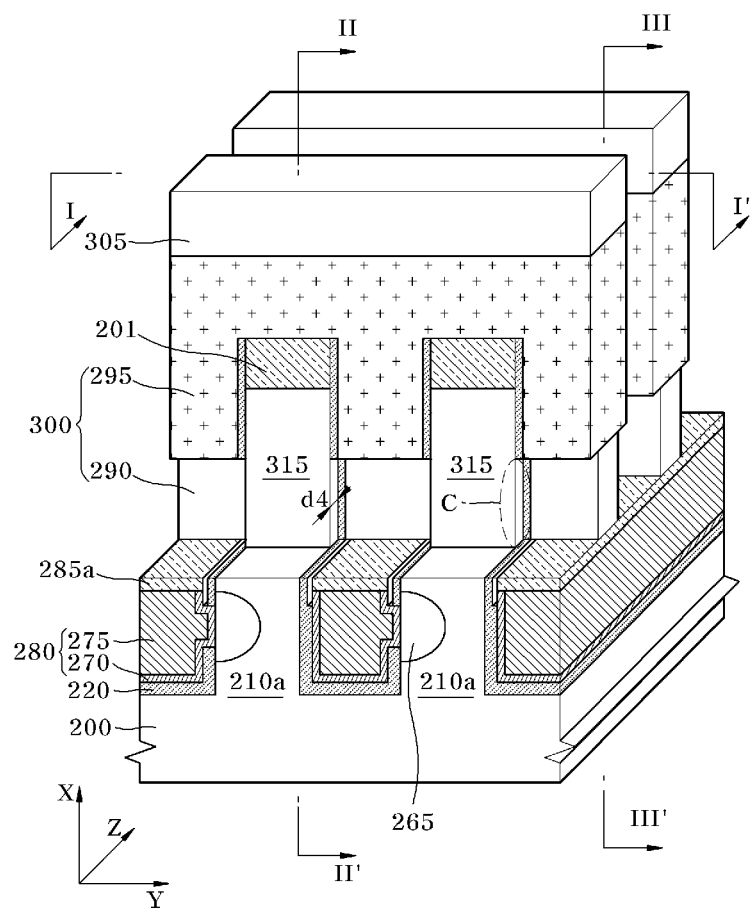
Figure 16B:
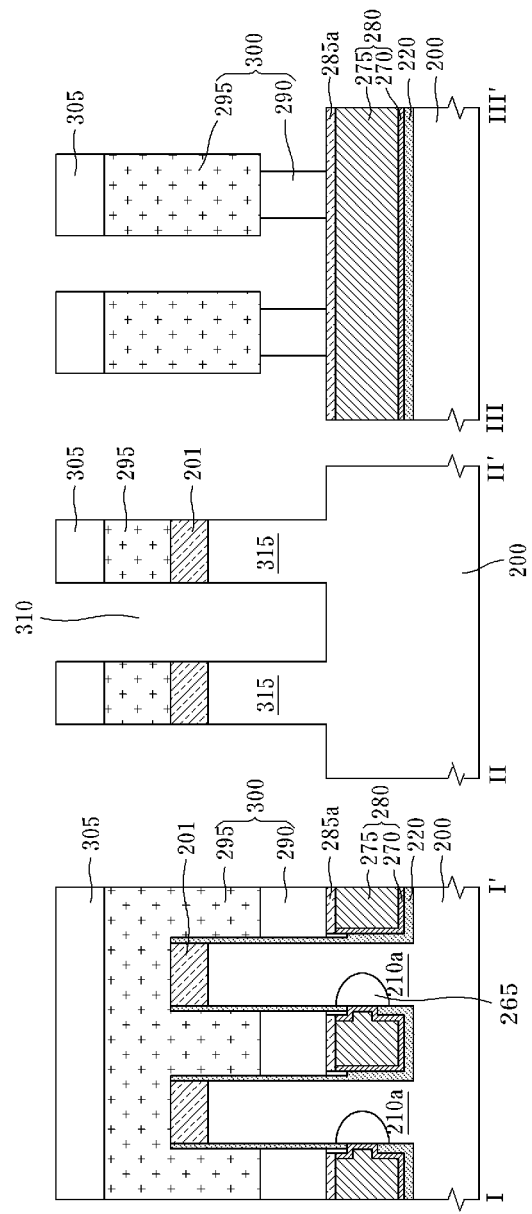

Referring to FIGS. 16A and 16B, a pre-cleaning process is performed to clean the surfaces of the upper pillar 315 in a second trench 310. The pre-cleaning process is performed in order to remove residues or natural oxide films formed during the formation of the second trench 310. The pre-cleaning process may be performed by supplying a wet cleaning solution on the semiconductor substrate 200. During the pre-cleaning process, the SOD film of the first interlayer dielectric film 290 is laterally recessed by a predetermined thickness d4 in the Z-direction of the semiconductor substrate 200, that is, along the direction of the buried bit line 280.

The etch rate of the first interlayer dielectric film 290 formed of a SOD film, which is the lower layer of the multi-layered interlayer dielectric film 300, is faster than the etch rate of the HDP oxide film of the second interlayer dielectric film 295, which is the upper layer of the multilayered interlayer dielectric film 300. This is because the film quality of a SOD film is relatively looser than the film quality of a HDP oxide film, and thus a SOD film is more influenced by the cleaning solution. Due to the difference in etch rates, the SOD film is etched more quickly by the cleaning solution than the HDP oxide film, even though the same wet cleaning solution is used for etching. As in FIG. 16B showing the cross-sectional view taken along line III-III' of FIG. 16A, the first interlayer dielectric film 290 formed of a SOD film is recessed inwardly by a thickness d4. In this case, the first liner film 220 formed of an oxide film formed on the recessed portion of the SOD film is also recessed by the same thickness d2 as the SOD film.

The pre-cleaning process is performed while adjusting the type of the cleaning solution and the cleaning time, so that the recessed thickness of the first interlayer dielectric film 290 formed of the SOD film is in a range of approximately 50 Å to approximately 100 Å in the Z-direction. The second interlayer dielectric film 295 formed of the HDP oxide film supports the upper pillar 315 so that the upper pillar 315 is neither collapsed nor bent, while the first interlayer dielectric film 290 formed of the SOD film is being recessed. As such, the first interlayer dielectric film 290 and the first liner film 220 are recessed in the Z-direction of the semiconductor substrate, so that the outer side of the upper pillar 315 is further expanded and exposed (see "C" in FIG. 16A). In this case, the first interlayer dielectric film 290 is recessed by approximately 50 Å to approximately 100 Å, and the expanded outer side of the upper pillar 315 (which has been exposed due to recessing of the first interlayer dielectric film 290) is exposed not to exceed approximately 100 Å. In addition, the first interlayer dielectric film 290 may be recessed to expose ½ or more of the outer side of the upper pillar 315, or the entire outer side of the upper pillar 315 may be exposed by entirely recessing the first interlayer dielectric film 290.

Figure 17A:
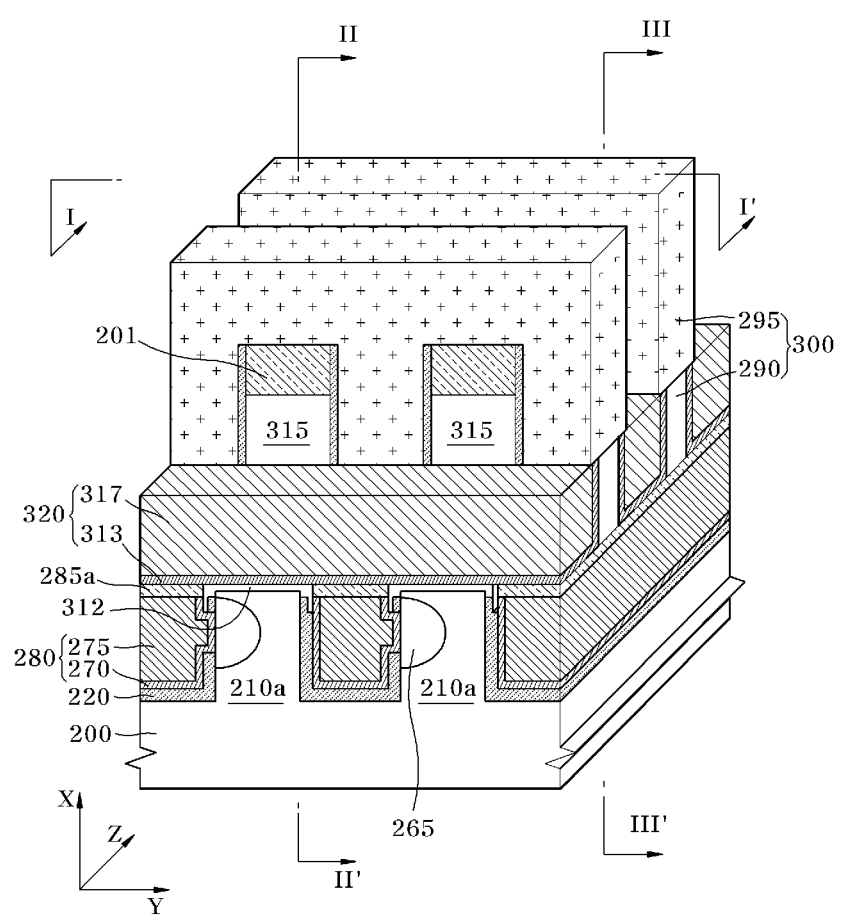
Figure 17B:
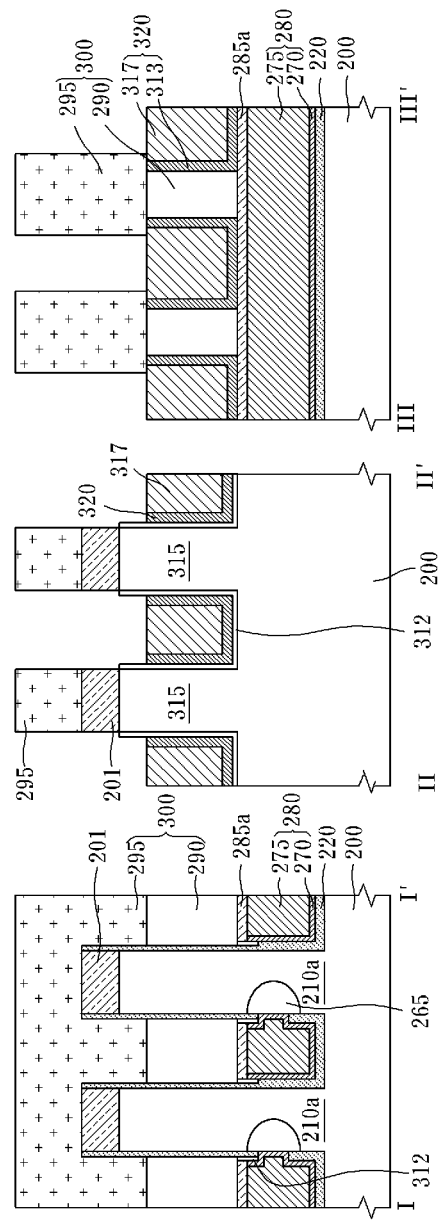

Referring to FIGS. 17A and 17B, a gate electrode 320 filling a portion of the second trench 310 (labeled in FIG. 16A). A gate dielectric film 312 is formed on the exposed surface of the second trench 310. The gate dielectric film 312 may be formed using an oxide film by performing an oxidation process including a thermal oxidation process or a radical oxidation process. A barrier metal film 313 and a gate metal film 317 are sequentially deposited on the gate dielectric film 312. The barrier metal film 313 may be formed in a single layer structure of a titanium (Ti) film or a titanium nitride (TiN) or a multilayer structure thereof. The gate metal film 317 may be formed using a tungsten (W) film.

The barrier metal film 313 and the gate metal film 317 are recessed, so that a predetermined portion thereof remains at a predetermined thickness between the upper pillars 315 and the remaining portion is removed. Accordingly, a gate electrode 320 filling a portion of a space between the upper pillars 315 is formed. As shown in FIG. 17A, the gate electrode 320 is formed to extend in the Y-direction of the semiconductor substrate 200 and is arranged to vertically cross the buried bit line 280. The excess portions of the barrier metal film 313 and the gate metal film 317 are removed so that the top surface of the gate electrode 320 is positioned to be equal to or lower than the top surface of the first interlayer dielectric film 290. In a case where the gate electrode 320 is positioned to be lower than the first interlayer dielectric film 290, a portion of the gate dielectric film 312 may be exposed. In some cases, a planarization process may be performed before the barrier metal film 313 and the gate metal film 317 are recessed. Referring to FIG. 17B, which is a cross-sectional view taken along line III-III' of FIG. 17A, the gate electrode 320 is formed to surround the outer side of the upper pillar 315 exposed in the recess process and to extend up to the upper pillar 315 exposed by the recessed first interlayer dielectric film 290 (see "C" in FIG. 16A).

Figure 18A:
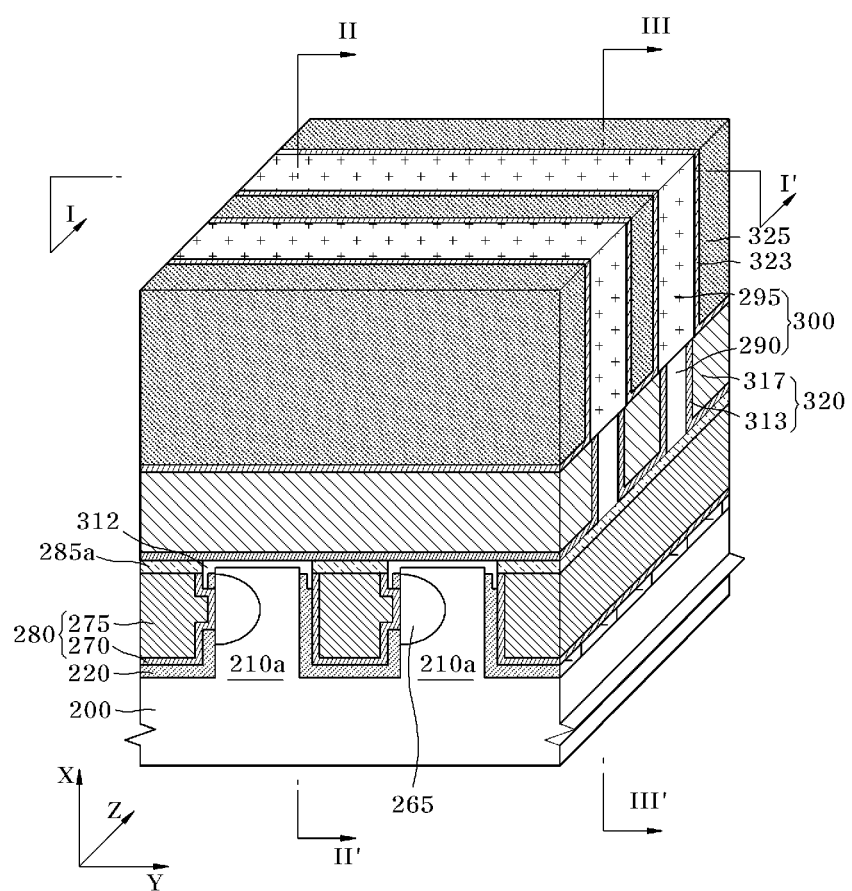
Figure 18B:
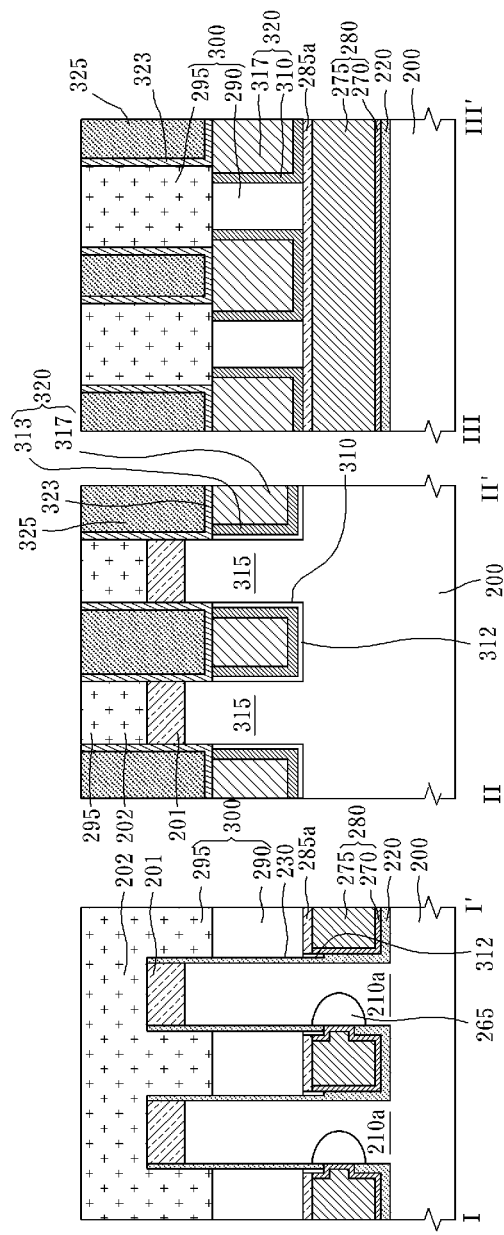

Referring to FIGS. 18A and 18B, a first spacer material film 323 and a second spacer material film 325 are sequentially formed in the second trench 310 of the semiconductor substrate 200 in which the gate electrode 320 is formed. To this end, the first spacer material film 323 is formed on the gate electrode 320. The first spacer material film 323 may include a nitride film. The second spacer material film 325 is formed on the first spacer material film 323. The second spacer material film 325 may include an oxide film. The surface of the second interlayer dielectric film 295 is exposed by performing a planarization process on the second spacer material film 325.

Figure 19A:
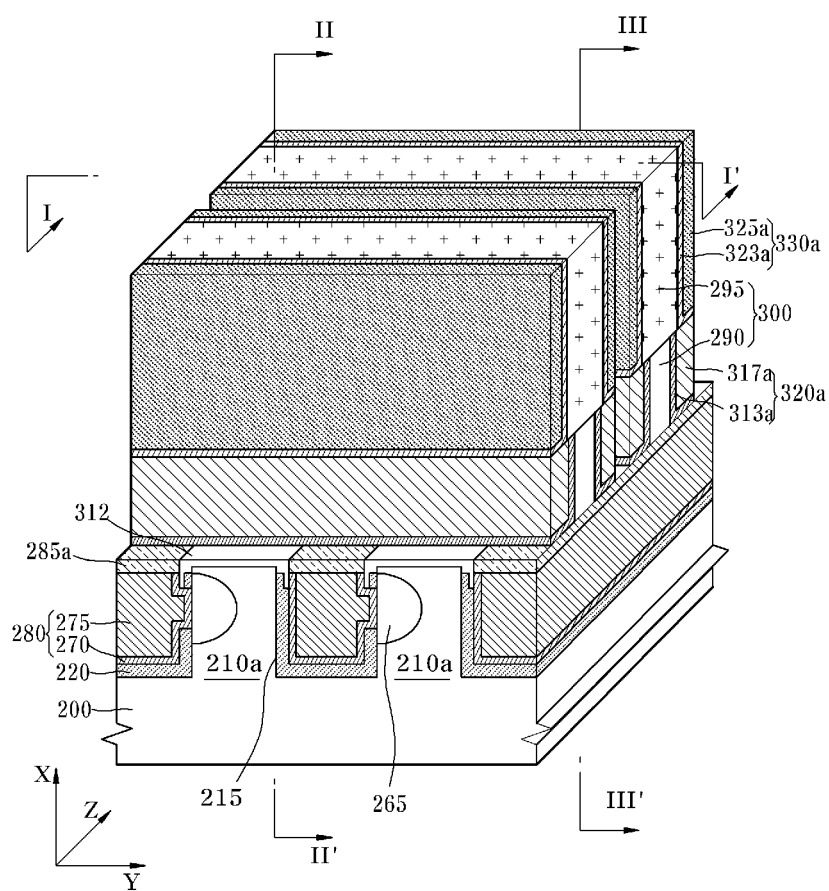
Figure 19B:
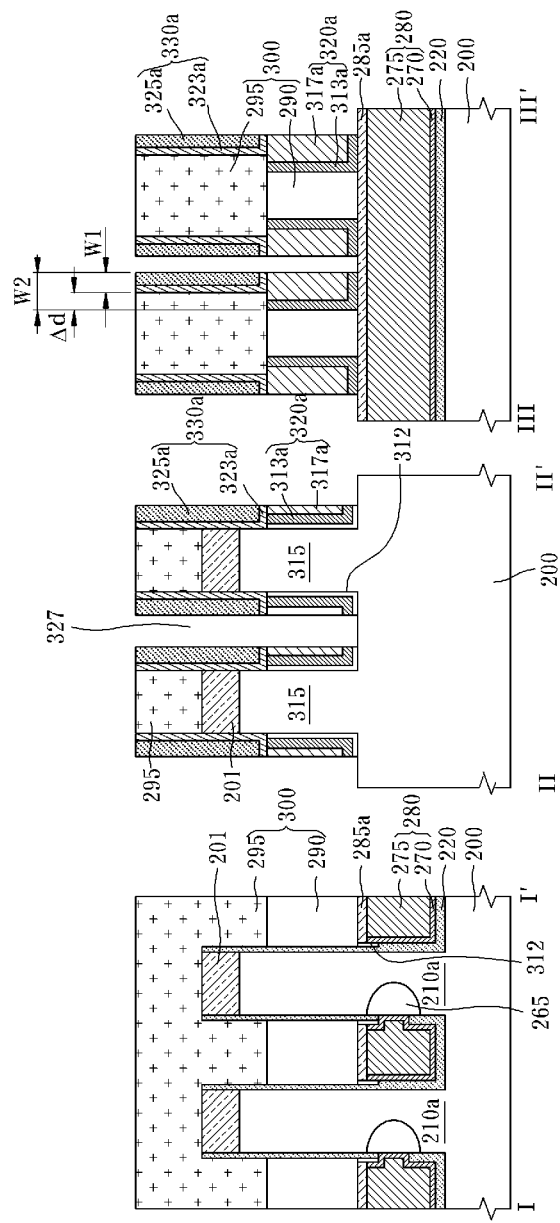

Referring to FIGS. 19A and 19B, a gate 320a is formed by a gate patterning process. Specifically, a resist pattern (not shown) defining a region for a gate 320a is formed on the second spacer material film 325 (labeled in FIG. 18A). An etch process is performed using the resist pattern as an etch mask. The etch process for forming the gate 320a is performed until the surface of the etch stop film 285a is exposed by applying the etch stop film 285a as the end point. An empty space 327 is formed between the upper pillars 315 by the etch process. Due to the empty space 327, the gate electrodes 320 (labeled in FIG. 18A) are separated to form the gate 320a. The gate 320a is disposed in the Y-direction of the semiconductor substrate 200, that is, the direction crossing the buried bit line 280 extending in the Z-direction of the semiconductor substrate 200. Referring to FIG. 19B, which is a cross-sectional view taken along line II-II' of FIG. 19A, the gate 320a is formed to surround the outer surface of the upper pillar 315. In addition, on the gate 320a, a first spacer film 323a and a second spacer film 325a are disposed on the sidewalls of the first hard mask 201 and the second interlayer dielectric film 295 in a spacer shape 330a.

Referring to FIG. 19B showing the cross-sectional view taken along line III-III' of FIG. 19A, the gate 320a is formed to surround the outer surface of the upper pillar 315 and extend up to the outer surface of the upper pillar 315 exposed by the recessed first interlayer dielectric film 290 (see "C" in FIG. 16A). Accordingly, the semiconductor memory device according to an embodiment of the present invention has the channel width W2, which has been extended by the predetermined width ($\Delta d$) up to the outer side of the upper pillar 315, which was further recessed and more exposed than the channel width W1 of the case in which the gate is formed on only the sidewall of the upper pillar 315. Thus, the channel width increases to "$2(W1+\Delta d)$". The extended width ($\Delta d$) is equal to the width of the outer side of the upper pillar 315 exposed by the first interlayer dielectric film 290 recessed in the Z-direction. That is, the gate 320 according to an embodiment of the present invention is formed to surround the outer side of the upper pillar 315 and extend up to the upper pillar 315 exposed by the recessed first interlayer dielectric film 290. Thus, since the area of the gate contacting the active region of the semiconductor memory device increases, and the surrounding gate effect occurs, the gate resistance can be reduced and the gate control ability can be improved. In addition, in the conventional process, since the interlayer dielectric film is formed in a single layer structure, the entire interlayer dielectric film is removed during the pre-cleaning process. Since the critical dimension of the gate formed after the gate etch process, that is, the ratio occupied by the gate metal film within the gate is limited to the side width of the active region, it is difficult to reduce the gate resistance. According to an embodiment of the present invention, the interlayer dielectric film is formed using two films having different etch selectivities. Since the entire outer side of the active region is exposed, the critical dimension of the gate is increased, thereby reducing the gate resistance.

According to an embodiment of the present invention, since the etch stop film is formed on the buried bit line, the etch process can be performed while the surface of the buried bit line is uniformly maintained. In addition, since the isolated region where impurities do not almost exist is defined between the buried bit line junction region and the channel region by the etch stop film, it is possible to prevent the on-current from being reduced.

Furthermore, since the exposed area of the active region is increased, the contact area of the gate contacting the exposed surface of the active region is increased and thus the resistance is reduced.

Moreover, since the exposed area of the active area is increased, the channel width is increased. Thus, the stability and reliability of the device can be ensured.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a lower pillar formed on a substrate extending in a first direction and having a lower pillar height in the second direction, wherein a trench is formed along a sidewall of the lower pillar in the first direction of the substrate;
   a buried bit line junction region disposed on one sidewall of a first portion of the lower pillar;
   an upper pillar having an upper pillar height in the second direction and formed on the second portion of the lower pillar;
   a buried bit line formed in the trench to contact the buried bit line junction region and;
   an etch stop film disposed on a surface of the buried bit line exposed over the trench;
   a first interlayer dielectric film having a height less than the upper pillar height and formed contiguous to the upper pillar on a portion of the etch stop film;
   a second interlayer dielectric film formed on the first interlayer dielectric film; and
   a gate formed adjacent to a sidewall portion of the upper pillar and over the buried bit line to extend in a third direction.

2. The semiconductor memory device of claim 1, further comprising a spacer formed over the gate to extend in the third direction adjacent a sidewall of the second interlayer dielectric film.

3. The semiconductor memory device of claim 2, wherein the spacer comprises a first spacer formed on a second spacer.

4. The semiconductor memory device of claim 3, wherein the first spacer comprises a nitride film and the second spacer comprises an oxide film.

5. The semiconductor memory device of claim 1, wherein a liner film is formed in the trench between the buried bit line and a sidewall of the lower pillar.

6. The semiconductor memory device of claim 5, wherein the liner film comprises a silicon oxide film.

7. The semiconductor memory device of claim 1, wherein the etch stop film has a thickness of about 50 Å to about 300 Å.

8. The semiconductor memory device of claim 1, wherein the buried bit line comprises a titanium nitride (TiN) film and a tungsten (W) film.

9. The semiconductor memory device of claim 1, wherein the second interlayer dielectric film is formed of a material having a relatively lower etch rate than the first interlayer dielectric film.

10. The semiconductor memory device of claim 9, wherein the first interlayer dielectric film comprises a spin on dielectric (SOD) film, and the second interlayer dielectric film comprises a high density plasma (HDP) oxide film formed using an HDP process.

11. The semiconductor memory device of claim 1, wherein a sidewall of the first interlayer dielectric film is recessed in the first direction by about 50 Å to about 100 Å.

* * * * *